United States Patent
Kwag et al.

(10) Patent No.: US 11,222,797 B2
(45) Date of Patent: Jan. 11, 2022

(54) LED TRANSFER DEVICE COMPRISING MASK AND LED TRANSFERRING METHOD USING THE SAME

(71) Applicant: SAMSUNG ELECTRONICS CO., LTD., Suwon-si (KR)

(72) Inventors: Doyoung Kwag, Suwon-si (KR); Eunhye Kim, Suwon-si (KR); Sangmoo Park, Suwon-si (KR); Minsub Oh, Seoul (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/731,468

(22) Filed: Dec. 31, 2019

(65) Prior Publication Data

US 2020/0243358 A1 Jul. 30, 2020

(30) Foreign Application Priority Data

Jan. 30, 2019 (KR) .................. 10-2019-0012061

(51) Int. Cl.
*H01L 21/67* (2006.01)
*H01L 33/62* (2010.01)
(Continued)

(52) U.S. Cl.
CPC .... *H01L 21/67144* (2013.01); *H01L 21/6835* (2013.01); *H01L 25/0753* (2013.01);
(Continued)

(58) Field of Classification Search
CPC ........... H01L 21/6835; H01L 21/67144; H01L 21/67259; H01L 33/62; H01L 2221/68363;
(Continued)

(56) References Cited

U.S. PATENT DOCUMENTS 7,982,409 B2 7/2011 Hasnain et al.
8,646,505 B2 2/2014 Bibi et al.
(Continued)

FOREIGN PATENT DOCUMENTS

CN 108962789 A 12/2018
EP 2 541 631 A2 1/2013
(Continued)

OTHER PUBLICATIONS

International Search Report (PCT/ISA/210) dated May 15, 2020 issued by the International Searching Authority in International Patent Application No. PCT/KR2020/001054.
(Continued)

*Primary Examiner* — Vu A Vu
(74) *Attorney, Agent, or Firm* — Sughrue Mion, PLLC

(57) ABSTRACT

A light-emitting diode (LED) transfer device is provided. The LED transfer device includes a transfer assembly configured to move a first substrate, on which a plurality of LEDs are provided, above a second substrate, a laser light source configured to emit a laser beam toward the first substrate, a mask that is disposed between the first substrate and the laser light source and has a plurality of openings that are configured to be selectively exposed and blocked and a processor configured to control the transfer assembly to move the first substrate to a predetermined position and selectively rotate the first substrate, and control the mask to expose and block the plurality of openings corresponding to the plurality of LEDs to be transferred from the first substrate to the second substrate.

18 Claims, 22 Drawing Sheets

(51) Int. Cl.
  *H01L 25/075* (2006.01)
  *H01L 21/683* (2006.01)
(52) U.S. Cl.
  CPC .... *H01L 33/62* (2013.01); *H01L 2221/68368* (2013.01); *H01L 2221/68381* (2013.01); *H01L 2933/0066* (2013.01)
(58) Field of Classification Search
  CPC ......... H01L 2933/0066; H01L 25/0753; H01L 2221/68354; H01L 2221/68322; H01L 21/67294; H01L 2224/95
  USPC .......................................................... 438/28
  See application file for complete search history.

(56) References Cited

U.S. PATENT DOCUMENTS

| | | | |
|---|---|---|---|
| 8,675,171 | B2 | 3/2014 | Shibazaki |
| 9,842,782 | B2* | 12/2017 | Chen ................... H01L 21/6831 |
| 10,096,740 | B1* | 10/2018 | Chen ..................... H01L 27/156 |
| 10,319,706 | B2 | 6/2019 | Yoo et al. |
| 10,410,998 | B2 | 9/2019 | Kim et al. |
| 10,714,369 | B2 | 7/2020 | Hong |
| 10,755,958 | B2 | 8/2020 | Arai |
| 2013/0122610 | A1* | 5/2013 | Chung ................ H01L 21/6838 438/7 |
| 2017/0064884 | A1* | 3/2017 | Kim ..................... H05K 13/041 |
| 2017/0345692 | A1 | 11/2017 | Liu et al. |
| 2018/0233496 | A1 | 8/2018 | Yoo et al. |
| 2019/0221466 | A1* | 7/2019 | Arai ..................... H01L 25/0753 |
| 2019/0252360 | A1 | 8/2019 | Yoo et al. |
| 2019/0393066 | A1 | 12/2019 | Hong |

FOREIGN PATENT DOCUMENTS

| | | |
|---|---|---|
| JP | 2018060993 A | 4/2018 |
| JP | 6374062 B2 | 8/2018 |
| KR | 101181413 B1 | 9/2012 |
| KR | 10-2016-0037248 A | 4/2016 |
| KR | 10-2018-0056819 A | 5/2018 |
| KR | 10-1890934 B1 | 8/2018 |
| KR | 10-2018-0103624 A | 9/2018 |
| WO | 2018/035668 A1 | 3/2018 |

OTHER PUBLICATIONS

Written Opinion (PCT/ISA/237) dated May 15, 2020 issued by the International Searching Authority in International Patent Application No. PCT/KR2020/001054.

Communication dated Nov. 5, 2021 issued by the European Patent Office in European Application No. 20748248.0.

* cited by examiner

LED TRANSFER DEVICE COMPRISING MASK AND LED TRANSFERRING METHOD USING THE SAME

CROSS-REFERENCE TO RELATED APPLICATION(S)

This application is based on and claims priority under 35 U.S.C. § 119 to Korean Patent Application No. 10-2019-0012061, filed on Jan. 30, 2019, in the Korean Intellectual Property Office, the disclosure of which is incorporated by reference herein in its entirety.

BACKGROUND

1. Field

The disclosure relates to a light-emitting diode (LED) transfer device which transfers a plurality of LEDs formed on a wafer to a printed circuit board of a display panel, and an LED transferring method using the same.

2. Description of Related Art

An LED is an inorganic light-emitting substance that emits light, and that might not require a color filter and a backlight to do so.

An LED may be manufactured in the form of a chip on a wafer, may be arranged on a target substrate, and may constitute a light-emitting module of a display.

Based on manufacturing tolerance, different semiconductor chips may exhibit different performance such as brightness, color, etc. The semiconductor chips may be provided on a wafer. Accordingly, different areas of the wafer may be associated with semiconductor chips exhibiting different performance.

Semiconductor chips provided on the wafer may be transferred to a target substrate. The semiconductor chips may be arranged on the target substrate in substantially the same arrangement as on the wafer. Accordingly, different areas of the target substrate may be associated with semiconductor chips exhibiting different performance.

A display may be manufactured using the target substrate. Because different areas of the target substrate are associated with semiconductor chips that exhibit different performance, the display may exhibit non-uniform luminance or color.

SUMMARY

Provided are an LED transfer device which transfers a plurality of LEDs such that uniformity of performances or characteristics among a plurality of LEDs arranged on a second substrate is improved, and an LED transferring method thereof.

Additional aspects will be set forth in part in the description which follows and, in part, will be apparent from the description, or may be learned by practice of the presented embodiments.

According to an aspect of the disclosure, a light-emitting diode (LED) transfer device may include a transfer assembly configured to move a first substrate, on which a plurality of LEDs are provided, above a second substrate, a laser light source configured to emit a laser beam toward the first substrate, a mask that is disposed between the first substrate and the laser light source and has a plurality of openings that are configured to be selectively exposed and blocked and a processor configured to control the transfer assembly to move the first substrate to a predetermined position and selectively rotate the first substrate, and control the mask to expose and block the plurality of openings corresponding to the plurality of LEDs to be transferred from the first substrate to the second substrate.

The processor may control the transfer assembly to rotate the first substrate in a first direction and a second direction which is opposite to the first direction such that output characteristics among a plurality of transfer areas of the second substrate on which the plurality of LEDs are transferred are substantially uniform.

The mask may include a blind which is configured to be selectively changed between a first mode and a second mode. In the first mode, first openings among the plurality of openings are opened, the first openings corresponding to a first group of LEDs, among the plurality of LEDs, to be arranged on the second substrate, and in the second mode, second openings among the plurality of openings opened, the second openings corresponding to a second group of LEDs, among the plurality of LEDs, to be arranged on the second substrate between the first group of LEDs.

The processor may, based on the blind being in the first mode, control the transfer assembly to set the first substrate in a first position, and based on the blind being in the second mode, control the transfer assembly to set the first substrate in a second position different from the first position.

The second position may be rotated by 180 degrees with respect to the first position.

The LED transfer device may include an adhesive layer provided between each of the plurality of LEDs and the first substrate, and the laser beam may transfer heat to the adhesive layer and separates the plurality of LEDs from the first substrate.

The first group of LEDs and the second group of LEDs may be arranged in parallel in a diagonal direction on the first substrate.

The first group of LEDs and the second group of LEDs may be arranged in parallel in a diagonal direction on the second substrate.

The LEDs of the first group of LEDs may include first anodes and first cathodes, and the LEDs of the second group of LEDs may include second anodes and second cathodes that are rotated 180 degrees with respect to the first anodes and the first cathodes. First anode pads and first cathode pads may be provided on the second substrate to which the first group of LEDs are transferred and may be arranged in a same direction as second anode pads and second cathode pads on the second substrate to which the second group of LEDs are transferred.

The LEDs of the first group of LEDs may include first anodes and first cathodes, and the second group of LEDs may include second anodes and second cathodes. First anode pads and first cathode pads may be provided on the second substrate to which the first group of LEDs are transferred and may be rotated by 180 degrees with respect to second anode pads and second cathode pads on the second substrate to which the second group of LEDs are transferred.

According to an aspect of the disclosure, a light-emitting diode (LED) transfer device may include a first stage configured to support a first substrate on which a plurality of LEDs are provided, a second stage configured to support a second substrate, a first picker configured to pick a first group of LEDs among the plurality of LEDs from the first substrate, and place the first group of LEDs on the second substrate, a second picker configured to pick a second group of LEDs among the plurality of LEDs from the first substrate, and place the second group of LEDs on the second substrate, the second group of LEDs being different from the first group of LEDs, and a processor configured to control the first picker and the second picker to place the first group of LEDs and the second group of LEDs on the second substrate in an alternating manner.

The first picker may include a plurality of first picking parts configured to pick the first group of LEDs from the first substrate, and the second picker may include a plurality of second picking parts configured to pick the second group of LEDs from the first substrate.

The first picker and the second picker may be respectively driven by different driving devices.

The first picker and the second picker may be driven by a single driving device, and are connected to a head of the single driving device.

The first picker and the second picker may be connected together via the head, and an elevating operation of the first picker is performed in an opposite manner as an elevating operation of the second picker.

The first substrate may include an adhesive layer formed between each of the plurality of LEDs and the first substrate such that the plurality of LEDs can be picked from the first substrate by the first picker and the second picker, and the anodes and cathodes of each of the plurality of LEDs may be attached to the adhesive layer.

According to an aspect of the disclosure, a light-emitting diode (LED) transferring method may include providing a first substrate in a first position, transferring a first group of LEDs among a plurality of LEDs on the first substrate to a second substrate, rotating the first substrate in a first direction, moving the first substrate to a second position that is different from the first position, and transferring a second group of LEDs among the plurality of LEDs on the first substrate to the second substrate.

The LED transferring method may include, after transferring the second group of LEDs to the second substrate, rotating the first substrate in a second direction that is opposite to the first direction.

A first angle by which the first substrate rotates in the first direction and a second angle by which the first substrate rotates in the second direction may be respectively 180 degrees.

According to an aspect of the disclosure, a non-transitory computer-readable medium may include a program for executing a light-emitting diode (LED) transferring method, and the LED transferring method may include providing a first substrate in a first position, transferring a first group of LEDs among a plurality of LEDs on the first substrate to a second substrate, rotating the first substrate in a first direction, moving the first substrate to a second position that is different from the first position, and transferring a second group of LEDs among the plurality of LEDs on the first substrate to the second substrate.

The display module according to an embodiment of the disclosure may be applied to an electronic product or an electronic device that implements a wearable device, a portable device, a handheld device, or various displays, in a single unit. The display module can also be applied to a display device such as a monitor for a personal computer, a TV, and a large format display device such as a digital sign, an electronic display having a plurality of assembly arrangements, etc.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
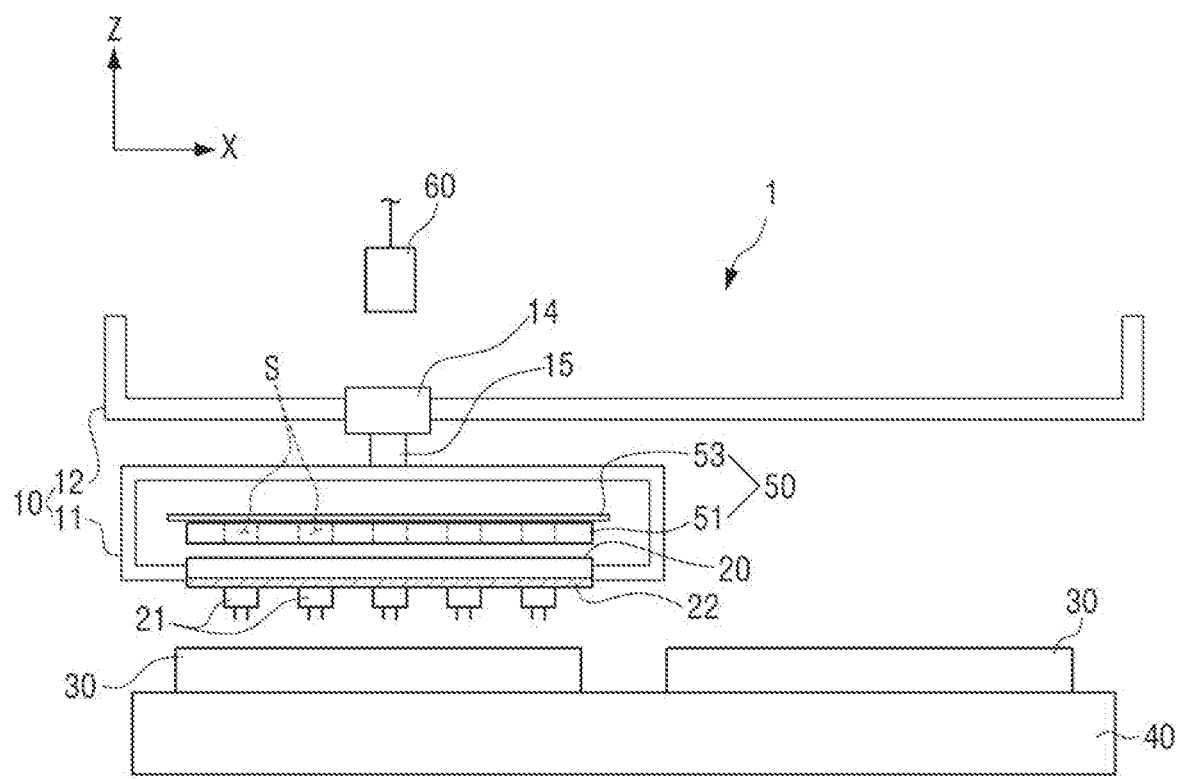
FIG. 1 is a schematic diagram illustrating an LED transfer device according to an embodiment.

Hereinafter, embodiments of the disclosure will be described with reference to the accompanying drawings.

Meanwhile, the disclosure is not limited to the embodiments described herein, but may be implemented in various forms, and various modifications may be made to the embodiments of the disclosure. The descriptions of the embodiments of the disclosure are provided for comprehensiveness, and to provide persons having ordinary knowledge in the technical field to which the disclosure belongs with comprehensive understanding of the range of the disclosure. Meanwhile, in the accompanying drawings, components may include enlarged sizes than as compared to their actual sizes for convenience of description, and the proportion of each component may be exaggerated or reduced.

Also, the description that a component is "on top of" or "contacts" another component may refer to the component being directly in contact with or being connected to the other component, and might not exclude the presence of another component between the components. In contrast, the description that a component is "directly on top of" or "directly contacts" another component may refer to the component being directly in contact with or being connected to the other component, and may exclude the presence of another component between the components. Other expressions describing relations between components such as "between" and "directly between" may be interpreted in a similar manner.

Further, terms such as "first," "second," and the like, may be used to describe various elements, but the elements are not intended to be limited by the terms. Such terms may be used to distinguish one element from another element. For example, a "first" element may be referred to as a "second" element, and a "second" element may be referred to as a "first" element in a similar manner, without departing from the scope of the disclosure.

Singular expressions include plural expressions, unless defined obviously differently in the context. Also, terms such as "include" or "have" should be construed as designating that there are such characteristics, numbers, steps, operations, elements, components, or a combination thereof, described in the specification, and may be interpreted to denote that one or more of other characteristics, numbers, steps, operations, elements, components or a combination thereof may be added.

The terms used in the embodiments of the disclosure may be interpreted based on meanings generally known to those of ordinary skill in the art described in the disclosure, unless defined differently in the disclosure.

Hereinafter, an LED transfer device according to an embodiment of the disclosure which, when transferring LEDs from a first substrate (e.g., a wafer on which a plurality of LEDs are provided in the form of semiconductor chips) to a second substrate (e.g., a substrate applied to a display module), transfers a plurality of LEDs to the second substrate to compensate for non-uniformity in performance of the semiconductor chips provided on the first substrate, and a transferring method using the same will be explained.

A display module to which the second substrate according to the disclosure is applied, as described above, may be applied to or installed in an electronic product or an electronic device that provides a wearable device, a portable device, a handheld device, or various displays, in a single unit. Also, the display module may also be applied to a display device such as a monitor for a personal computer (PC), a high resolution television (TV), a sign (or, a digital sign), an electronic display, etc. through a plurality of assembly arrangements in a matrix type.

Figure 2:
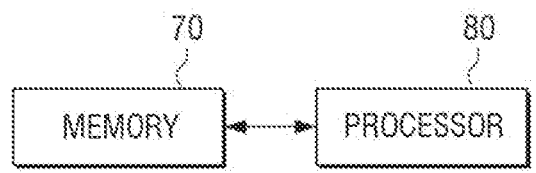
FIG. 2 is a block diagram illustrating a memory and a processor provided in an LED transfer device according to an embodiment.
Figure 3:
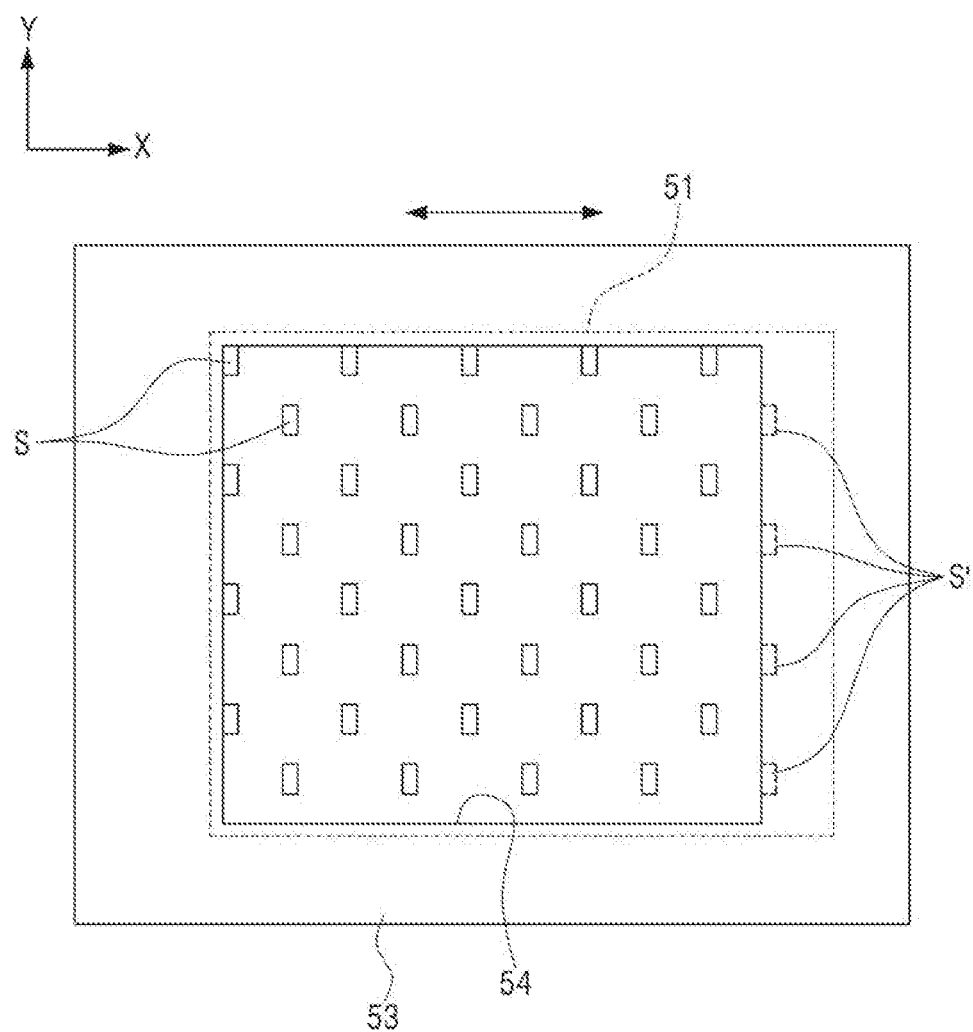
FIG. 3 is a diagram illustrating a mask unit of an LED transfer device according to an embodiment.
Figure 4:
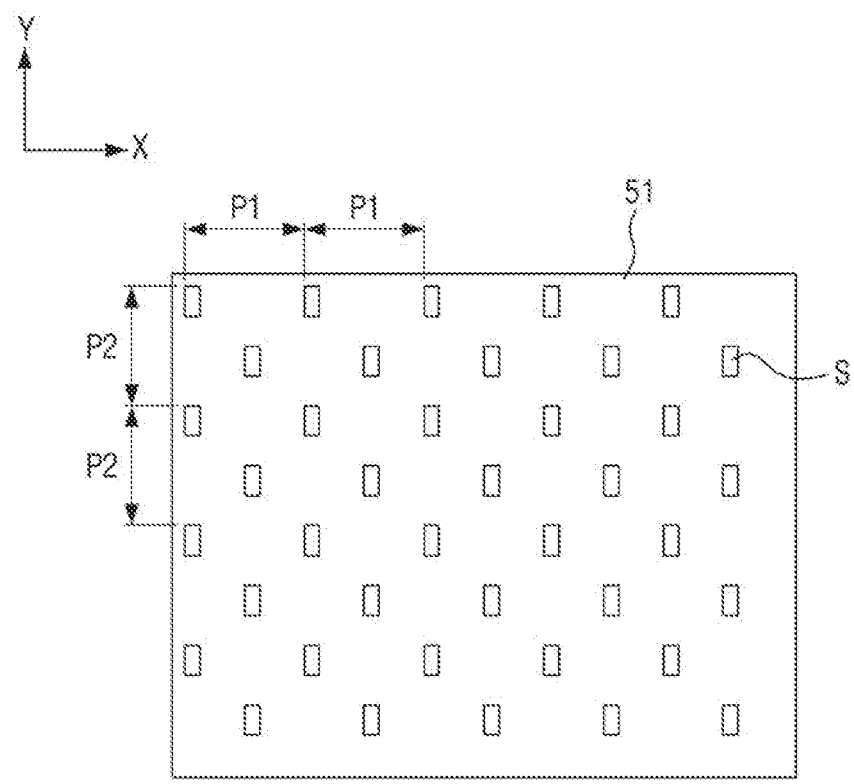
FIG. 4 is a diagram illustrating a mask of the mask unit illustrated in FIG. 3 according to an embodiment.

FIG. 1 is a schematic diagram illustrating an LED transfer device according to an embodiment. FIG. 2 is a block diagram illustrating an LED transfer device according to an embodiment. FIG. 3 is a diagram illustrating a mask unit of an LED transfer device according to an embodiment. FIG. 4 is a diagram illustrating a mask of the mask device illustrated in FIG. 3.

Referring to FIGS. 1 and 2, the LED transfer device 1 according to an embodiment may include a transfer assembly 10 that movably supports a first substrate 20 above a second substrate 30, a stage 40 on which the second substrate 30 is provided and which moves the second substrate 30, a mask unit (or mask) 50 which selectively allows laser beams radiated toward the first substrate 20 to pass through the mask unit 50, a laser light source 60 which radiates laser beams toward the first substrate 20, and a processor 80 which controls each of the transfer assembly 10, the stage 40, and the mask unit 50.

The transfer assembly 10 may include a fixing member 11 which supports the first substrate 20 such that a plurality of LEDs 21 are disposed toward and face the second substrate 30, and a guide member 12 to which the fixing member 11 is rotatably connected.

Based on the coordinate system illustrated in FIG. 1, the fixing member 11 may be connected to the guide member 12 via a rotation member 15 such that the fixing member 11 may move horizontally along the X-axis direction of the guide member 12 via a slider 14. Also, the fixing member 11 may rotate in a clockwise direction or a counterclockwise direction via the rotation member 15 about the Z-axis.

The guide member 12 may be slidably connected to guide rails (not shown) respectively arranged in the Y-axis direction such that the fixing member 11 may be moved horizontally in the Y-axis direction.

The first substrate 20 may be moved to any position on an X-Y plane via the fixing member 11 and the guide member 12, and may rotate in a clockwise direction or a counterclockwise direction via the rotation member 15 about the Z-axis.

Although FIG. 1 depicts the fixing member 11 as fixing the first substrate 20 by supporting the edge area of the first substrate 20, the fixing member 11 is not limited thereto, and may be connected to any portion of the first substrate 20 via a component or method that can stably fix the fixing member 11 to the first substrate 20 such as, for example, various clamping structures, a vacuum suction method, etc. For convenience of explanation, the illustration of a driving device for rotating the fixing member 11 and a driving device for moving the guide member 12 is omitted in FIG. 1.

The guide member 12 may be arranged above the second substrate 30, and may move the fixing member 11 connected to the first substrate 20 to any position on the X-Y plane with respect to the second substrate 30. In addition, the guide member 12 may move the fixing member 11 via various structures such as a multiple joint structure, a piston structure, a sliding structure, etc.

The first substrate 20 may be a wafer. That is, the first substrate 20 may be a wafer on which a plurality of LEDs 21 are arranged on various substrates, such as a sapphire substrate, or the like.

An adhesive layer 22 may be provided on a bottom surface of the first substrate 20. The adhesive layer 22 may attach a plurality of LEDs 21 on the first substrate 20. Also, the adhesive layer 22 may include a material that is capable of being melted by a laser beam radiated on the first substrate 20 to permit the LEDs 21 to be separated from the first substrate 20.

The LED 21 may include an inorganic light-emitting material having a width, a length, and a height, respectively, that is less than or equal to 100 micrometers (μm), and may be configured to emit light when power is supplied to the LED 21.

In addition, the LED 21 may have fast reaction speed, low power consumption, and high luminance, and is thus gaining popularity as a light-emitting element for next generation displays. Specifically, the LED 21 may have higher efficiency of converting electrons to photons as compared to liquid crystal displays (LCDs) or optical light-emitting diodes (OLEDs). That is, the LED 21 has higher "brightness per watt" as compared to LCD or OLED displays. In this way, the LED 21 may exhibit substantially the same brightness while consuming substantially half of the energy as compared to conventional LEDs or OLEDs.

The LED 21 may implement high resolution, excellent color, contrast, and brightness, and may thus express color in a wide range with precision, and may also implement a clear screen even in outdoor environments susceptible to direct sunlight exposure. Also, the LED 21 may be resistant to burn-in phenomenon, and may generate a small amount of heat. Accordingly, the LED 21 may be less prone to deformation, and may improve product lifespan.

In addition, the LED 21 may be a red LED 21 configured to emit red light, a green LED 21 configured to emit green light, or a blue LED 21 configured to emit blue light.

LEDs 21 configured to emit light of the same color may be arranged on a single wafer. For example, red LEDs 21 configured to emit red light, green LEDs 21 configured to emit green light, or blue LEDs 21 configured to emit blue light may be provided on the first substrate 20.

Also, each of the LEDs 21 provided on the wafer may include an anode and a plurality of cathodes.

A first subset of LEDs 21*a* may be rotated by 180 degrees with respect to a second subset of LEDs 21*b*. Here, and referring to FIG. 7 as an example, "rotated by 180 degrees" may refer to the anodes and the cathodes of the second subset of LEDs 21*b* being arranged in an opposite direction to the anodes and the cathodes of the first subset of LEDs 21*a*.

Figure 16:
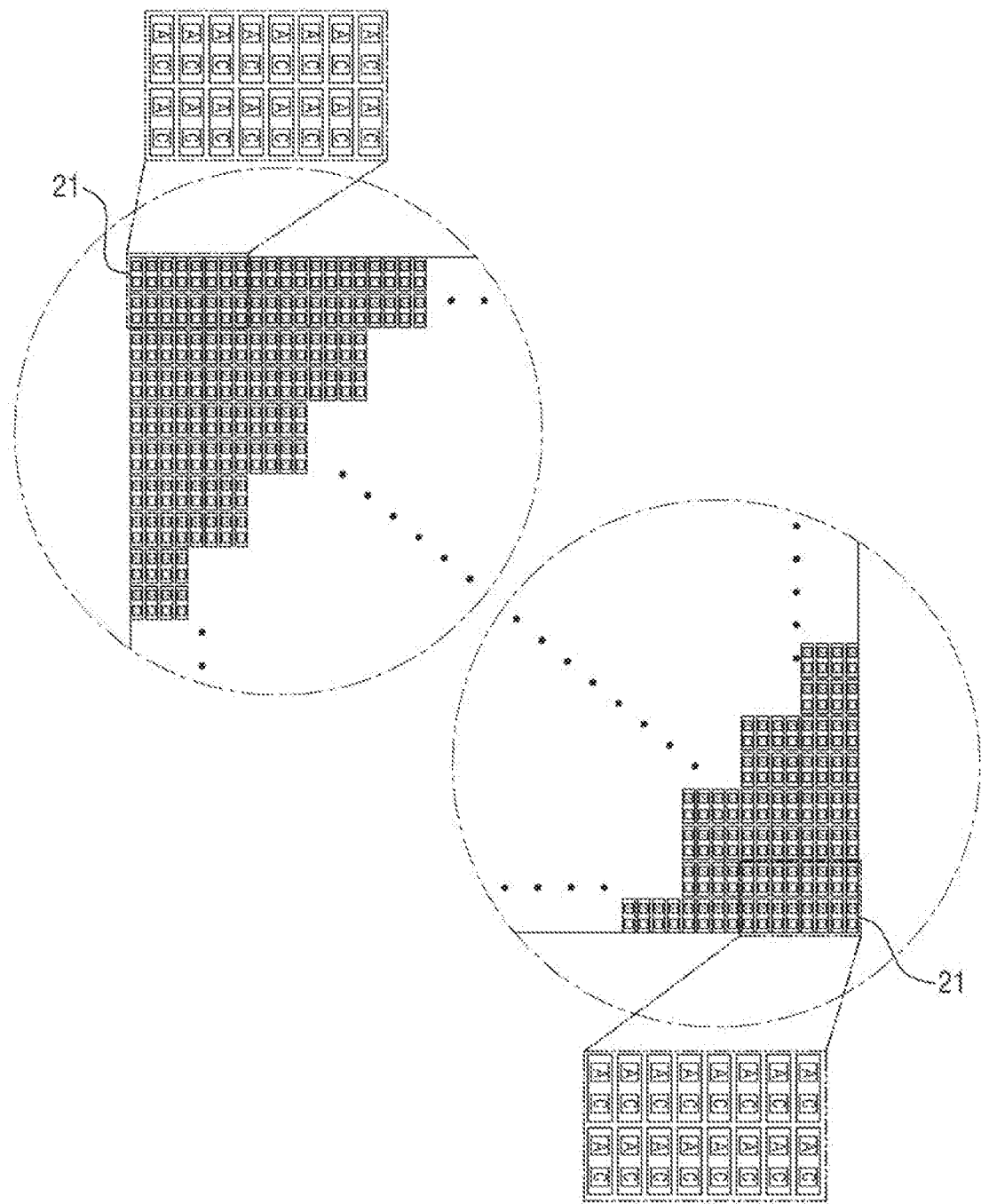
FIG. 16 is a diagram illustrating another example of the first substrate according to an embodiment.

Alternatively, and referring to FIG. 16 as an example, all of the anodes and the cathodes of all the LEDs 21 on a single wafer may be arranged in the same direction.

The second substrate 30 may be a target substrate, may be a printed circuit board (PCB) applied to a display panel, and may be formed in various sizes and shapes. Also, the second substrate 30 may be a relay substrate that receives the first substrate 20 and relays LEDs 21 to the PCB of the display panel.

A plurality of LEDs 21 transferred from the first substrate 20 may be mounted on the second substrate 30. Also, and referring to FIG. 8 as an example, a plurality of anode pads 31*a* and a plurality of cathode pads 31*b* to which the LEDs 21 are physically and electrically connected may be provided on the second substrate 30.

In this case, the arrangement of the plurality of anode pads 31*a* and the plurality of cathode pads 31*b* of the second substrate 30 may vary according to the arrangement of the anodes and the cathodes of the plurality of LEDs 21 arranged on the first substrate 20.

Figure 7:
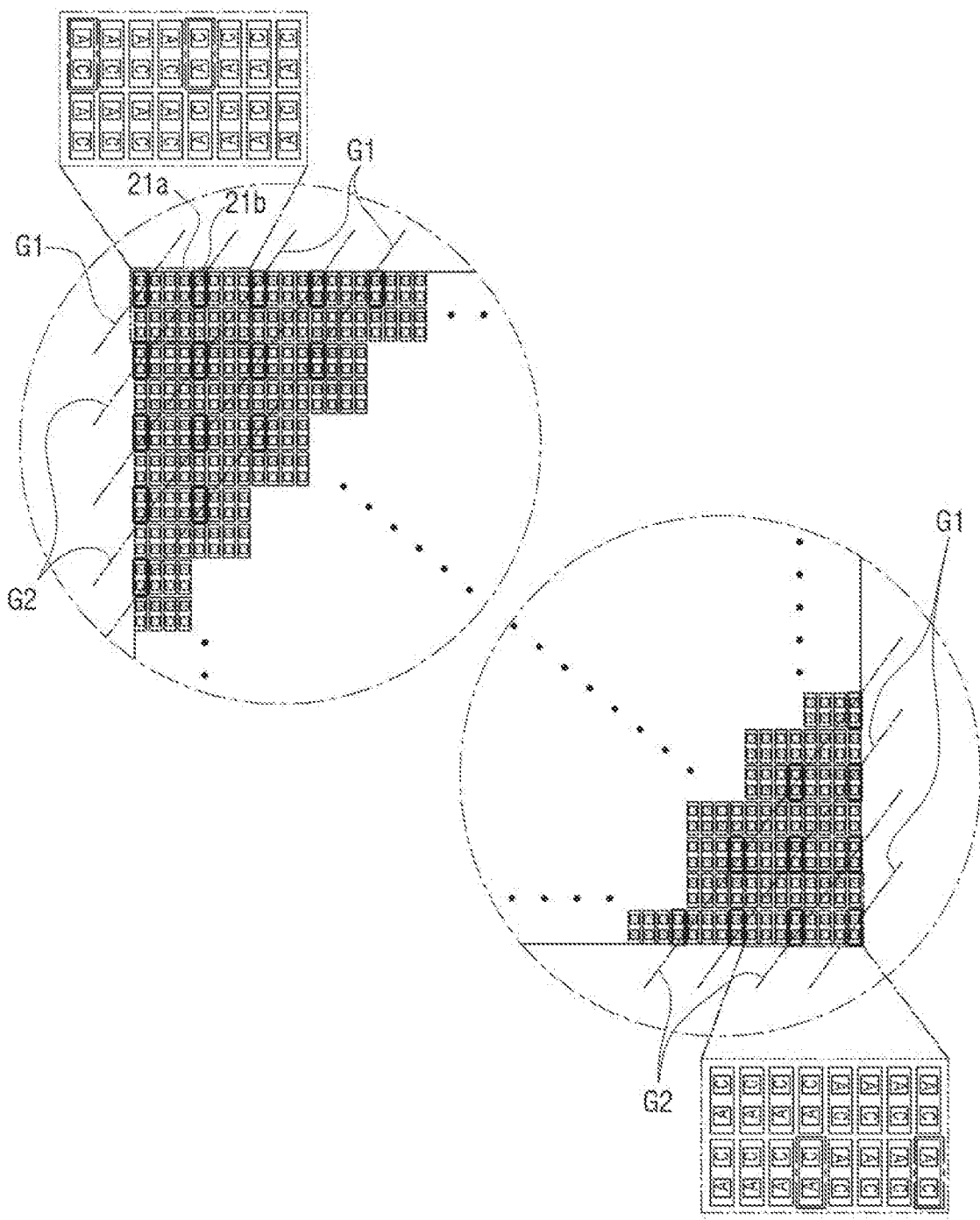
FIG. 7 is an enlarged view illustrating the section A and the section B illustrated in FIG. 6 according to an embodiment.
Figure 8:
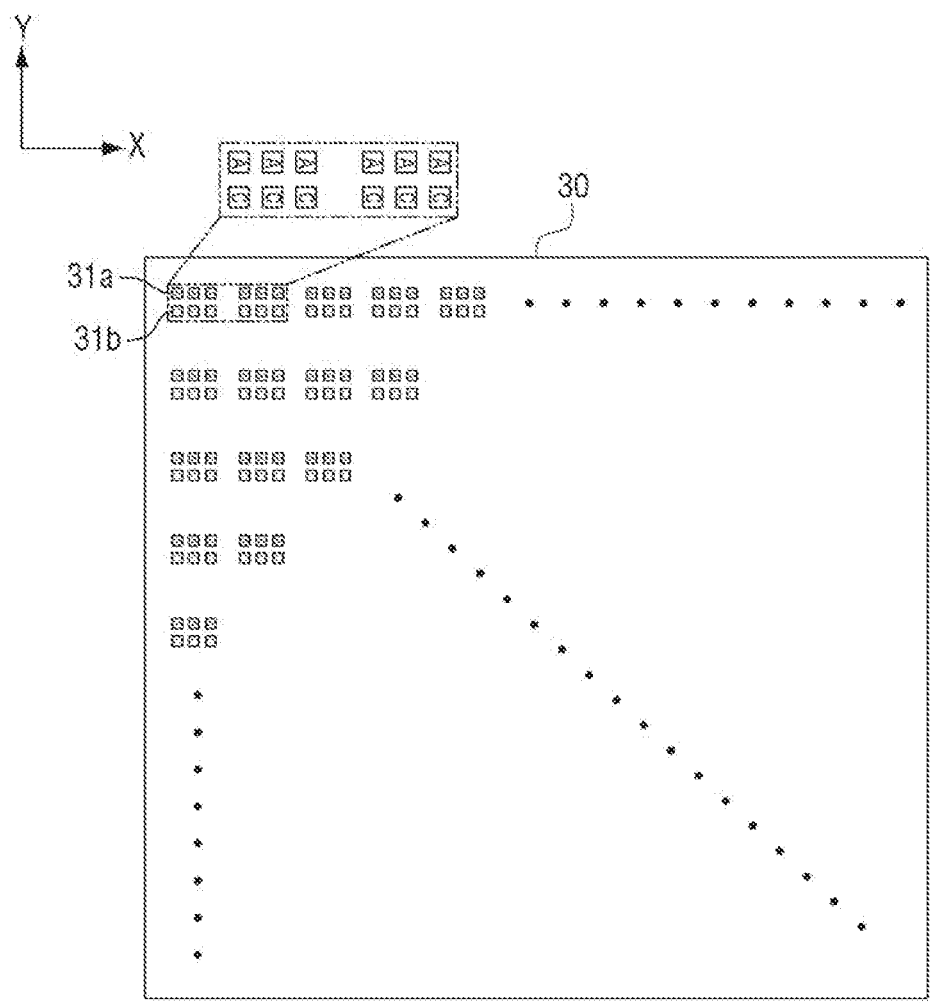
FIG. 8 is a diagram illustrating a second substrate according to an embodiment.

For example, and referring to FIGS. 7 and 8 as an example, if the second subset of LEDs 21*b* are rotated by 180 degrees with respect to the first subset of LEDs 21*a*, then each of the plurality of anode pads 31*a* and the plurality of cathode pads 31*b* on the second substrate 30 may be arranged in the same direction. Also, and referring to FIGS. 16 and 17 as an example, if all of the anodes and the cathodes of all of the LEDs 21 are formed in the same direction, then a first subset of the plurality of anode pads 31*a* and the plurality of cathode pads 31*b* on the second substrate 30 may be arranged in a same direction, and a second subset of the plurality of anode pads 31*a* and the plurality of cathode pads 31*b* on the second substrate 30 may be rotated by 180 degrees with respect to the first subset of the plurality of anode pads 31*a* and the plurality of cathode pads 31*b*.

The second substrate 30 may be provided on the stage 40, and the stage 40 may support the second substrate 30 to be arranged in parallel with respect to the first substrate 20.

The stage 40 may move with respect to the transfer assembly 10 while the second substrate 30 is provided on the stage 40. That is, the stage 40 may move horizontally along the X-Y plane. Also, the stage 40 may move vertically along the Z-axis direction. For convenience of explanation, the illustration of each driving device for the horizontal movement along the X-Y plane and the vertical movement of the stage 40 is omitted in FIG. 1.

The mask unit 50 may be arranged between the laser light source 60 and the first substrate 20, and may permit the laser beam emitted from the laser light source 60 to pass through the mask unit 50 toward the first substrate 20. The specific configuration of the mask unit 50 will be explained in more detail elsewhere herein with reference to FIGS. 3 and 4.

The laser light source 60 may radiate a laser beam toward the top surface of the first substrate 20 on which the plurality of LEDs 21 are not formed, and may cause the plurality of LEDs 21 to detach from the bottom surface of the first substrate 20 via the adhesive layer 22. The LEDs 21 that detach from the first substrate 20 via the laser beam may be transferred to the second substrate 30.

The laser light source 60 may directly radiate a laser beam toward the first substrate 20. Alternatively, a lens member (e.g., a P-lens, etc.) that may change the direction of the laser beam may be arranged on a path on which the laser beam is radiated.

In addition, the laser light source 60 may be a point laser beam, a line laser beam, an area laser beam, etc. A point laser beam may be a laser beam that is radiated toward a single point, and a line laser beam may be a laser beam that is radiated along a direction, such as along the X-axis or the Y-axis as shown in FIG. 1. An area beam may be a laser beam that is simultaneously radiated on a random area, or a laser beam that is simultaneously or sequentially radiated on a plurality of coordinate points. In this case, an area laser beam may be simultaneously or sequentially radiated in a plurality of parallel diagonal directions with respect to a random area.

The laser light source 60 may be a component of a laser beam scanner, and the laser beam scanner may be included in an LED transfer device 1 according to an embodiment.

The memory 70 illustrated in FIG. 2 may be included in the LED transfer device 1. The memory 70 may be implemented as at least one of a flash memory, a read-only memory (ROM), a random access memory (RAM), a hard disk, a micro multimedia card, a card-type memory (e.g., a secure digital (SD) or extreme digital (XD) memory, etc.), etc.

In addition, the memory 70 may be electrically connected to the processor 80, and thus may transmit signals and information to the processor 80. Accordingly, the memory 70 may store a program that, when executed by the processor 80, causes the processor 80 to control components of the LED transfer device 1 to transfer a plurality of LEDs 21 from the first substrate 20 to the second substrate 30.

The processor 80 may be included in the LED transfer device 1, and may be configured to control the overall operation of the LED transfer device 1. That is, the processor 80 may be electrically connected to each of the transfer assembly 10, the stage 40, the mask unit 50, and the laser light source 60, and may control each of the foregoing components.

For example, the processor 80 may control the transfer assembly 10 to horizontally move the first substrate 20 to a random location on an X-Y plane above the second substrate 30, and may rotate the first substrate 20 by a desired angle. Also, the processor 80 may horizontally move the stage 40 to a random location on an X-Y plane, and may vertically move the stage 40 in the vertical direction along the Z-axis. In addition, the processor 80 may control the laser light source 60 to radiate a laser beam toward a predetermined point of the first substrate 20.

Although it is described that all of the foregoing components are controlled by a single processor 80, embodiments are not limited thereto, and one or more components may be controlled by one or more processors 80.

The processor 80 may include a central processing unit (CPU), a controller, an application processor (AP), a communication processor (CP), an ARM processor, etc.

In addition, the processor 80 may be electrically connected to the memory 70, and may execute a program for LED transfer and utilize information stored in the memory 70. The specific functions of the processor 80 according to an embodiment will be explained in more detail elsewhere herein.

Hereinafter, the specific configuration of the mask unit 50 will be explained with reference to FIGS. 3 and 4.

Figure 5:
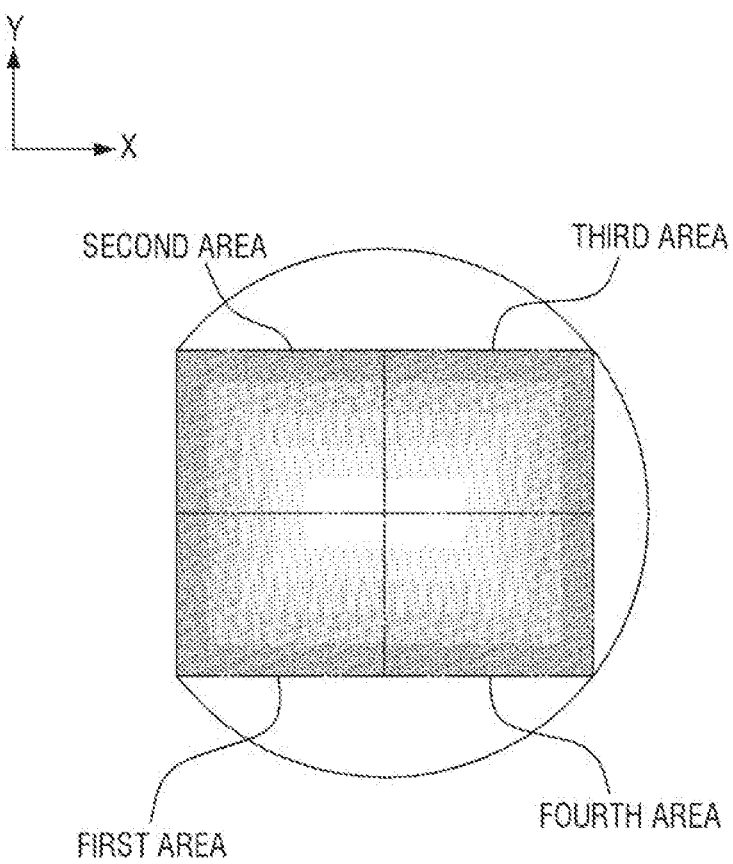
FIG. 5 is a diagram illustrating areas of a first substrate used by an LED transfer device according to an embodiment.
Figure 6:
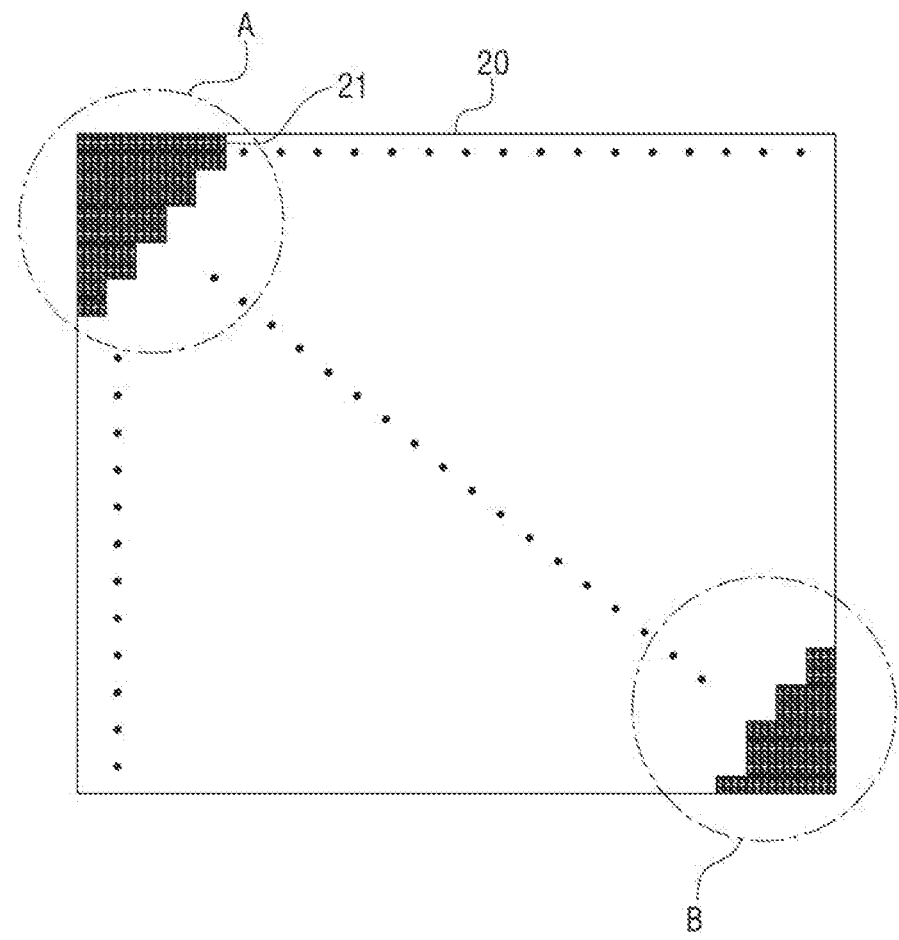
FIG. 6 is a diagram illustrating an enlarged area illustrated in FIG. 5 according to an embodiment.

FIG. 3 is a diagram illustrating a mask unit (or mask) of an LED transfer device according to an embodiment. FIG. 4 is a diagram illustrating a mask of the mask unit illustrated in FIG. 3. FIG. 5 is a diagram illustrating areas of a first substrate used by an LED transfer device according to an embodiment. FIG. 6 is a diagram illustrating an enlarged area illustrated in FIG. 5 according to an embodiment. FIG. 7 is an enlarged view illustrating the section A and the section B illustrated in FIG. 6 according to an embodiment.

The mask unit 50 may be arranged between the first substrate 20 and the laser light source 60 as shown in FIG. 1. Also, the mask unit 50 may move horizontally along the X-Y plane together with the first substrate 20 that is connected to the fixing member 11 of the transfer assembly 10. In this case, the mask unit 50 may be connected to the fixing member 11 in a state of not being influenced by the rotation of the fixing member 11. That is, when the fixing member 11 rotates in a clockwise direction or a counterclockwise direction to rotate the first substrate 20, the mask unit 50 may not rotate and may remain stationary.

Referring to FIG. 3, the mask unit 50 may include a mask 51, and may include a blind 53 that is arranged to be movable by a certain distance in the X-axis direction with respect to the mask 51.

Referring to FIG. 4, the mask 51 may be formed approximately in a plate form, and may include a plurality of openings S formed at regular intervals in the X-axis direction and the Y-axis direction that permit laser beams to pass through.

The plurality of openings S may be arranged at a first pitch P1 in the X-axis direction, and may be arranged at a second pitch P2 in the Y-axis direction. In this case, the first pitch P1 and the second pitch P2 may have the same lengths or different lengths. Here, the first and second pitches P1 and P2 may be set variously from tens of micrometers to hundreds of micrometers according to a user setting.

The plurality of openings S may be provided in rows. Further, odd numbered rows may include openings S that include the same position along the X-axis, and even numbered rows may include openings S that include the same position along the X-axis. Further still, the openings S of odd numbered rows may be offset with respect to the openings S of even numbered rows.

The mask 51 may include a material which blocks a laser beam, and may be heat-resistant to improve durability against the laser beam. In addition, a heat-resistant material which can endure the heat of the laser beam may be applied on a top surface of the mask 51 disposed toward and facing the laser light source 60.

Referring to FIG. 3, the blind 53 may be arranged above or below the mask 51, and may have an exposure hole 54 that exposes a first subset of openings among the openings S of the mask 51 at all times, and selectively exposes and blocks a second subset of openings S' and S".

The blind 53 may move along the X-axis by a certain distance and selectively expose and block the second subset of openings S' and S" of the mask 51. Here, the second subset of openings S' and S" may be openings that belong to a column arranged on the leftmost side and a column arranged on the rightmost side of the mask 21, respectively.

Figure 10:
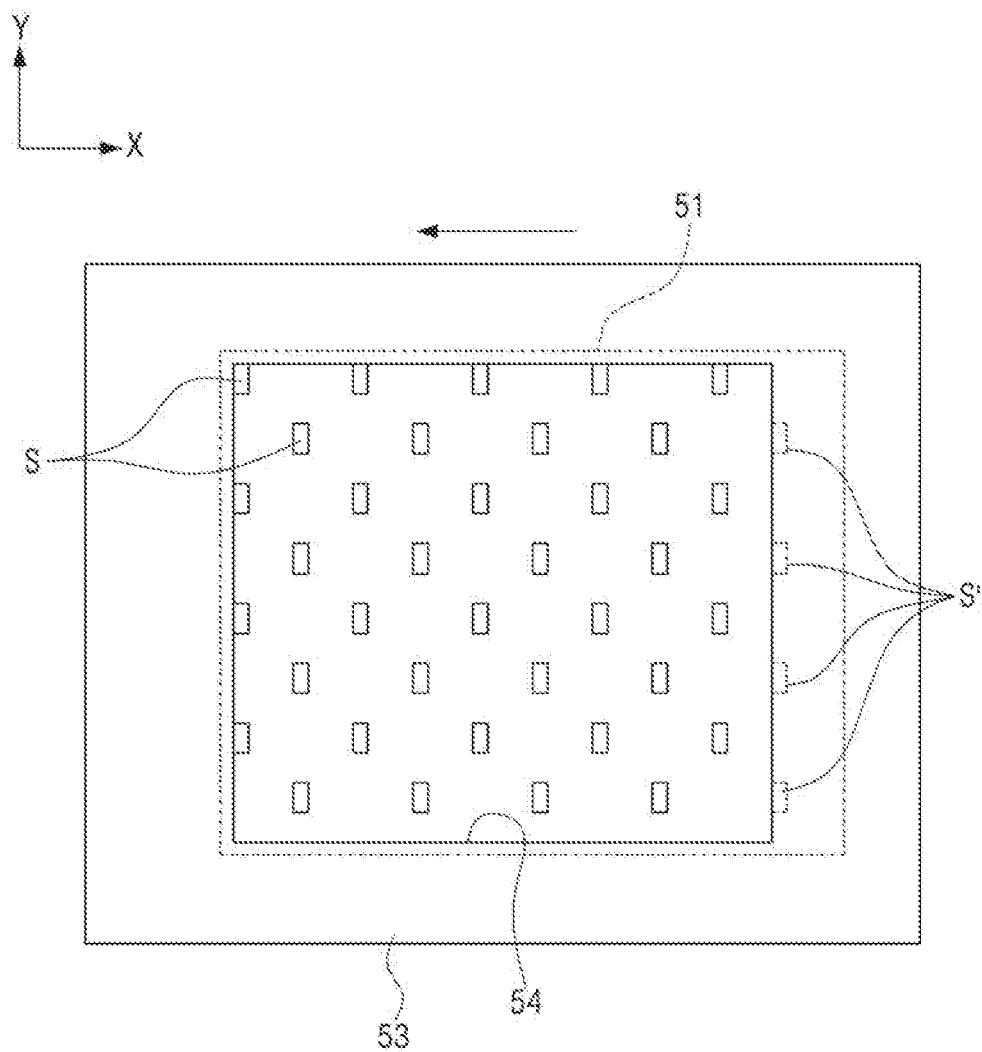
FIG. 10 is a diagram illustrating a state wherein a blind is moved to a left side with respect to the mask according to an embodiment.

In this case, and referring to FIG. 10, if the blind 53 moves to the left side in the X-axis direction and is set in a first position, openings S' constituting the right column are closed/blocked by the blind 53, and other openings S and S" of the mask 51 are opened/exposed by the exposure hole 54. In contrast, and referring to FIG. 13, if the blind 53 moves to the right side in the X-axis direction and is set in a second position, openings S" constituting the left column are closed/blocked by the blind 53, and the other openings S and S' are opened/exposed by the exposure hole 54.

According to such a configuration, if laser beams are radiated through openings S exposed by the exposure hole 54, each LED 21 on the first substrate 20 in a position corresponding to an opening may be separated from the bottom surface of the first substrate 20 by the laser beams, and may be transferred to the top surface of the second substrate 30. Here, the anode and the cathode of each LED 21 may respectively be physically and electrically connected to the anode pad 31a and the cathode pad 31b of the second substrate 30 via heat from the laser beams.

The plurality of openings S formed on the mask 51 may have various forms or sizes through which laser beams can pass to permit the transfer of the LEDs 21 on the first substrate 20 to the second substrate 30.

Also, the plurality of openings S may be formed on the mask 51 at the first and second pitches P1 and P2 in the X-axis and Y-axis directions, respectively. Here, pitches between each opening S may be set in consideration of the arrangement of the plurality of LEDs 21 on the first substrate 20.

In addition, the plurality of openings S may be arranged to constitute an arrangement wherein a plurality of LEDs 21 can be transferred in a diagonal direction according to an LED transferring method according to an embodiment.

The blind 53 may move in the X-axis direction or the Y-axis direction by a driving device which is not illustrated.

As described above, the blind 53 may move to the first or second position and selectively expose the openings S' and S" of the mask 51. The movement of the blind 53 to the first and second positions may respectively be synchronized with the rotation of the first substrate 20 from 0 degrees to 180 degrees. For example, when the blind 53 is in the first position, the first substrate 20 may be set to a 0 degree position, and when the blind 53 is in the second position, the first substrate 20 may be set to a position that is rotated 180 degrees from the 0 degree position.

As described above, as transfer of the LEDs 21 proceeds while movement of the blind 53 and rotation of the first substrate 20 are synchronized, when a plurality of LEDs 21 having different performance are transferred from the first substrate 20 to the second substrate 30, the LEDs 21 may be arranged in a manner that permits a display to exhibit more uniform performance. For example, a display panel to which the second substrate 30 manufactured by such an arrangement is applied, the display area may exhibit more uniform color, luminance, etc.

Hereinafter, the configurations of the first substrate 20 and the second substrate 30 applied to an LED transfer device 1 according to an embodiment will be explained with reference to FIGS. 5 to 8.

FIG. 5 is a diagram illustrating areas of a first substrate used by an LED transfer device according to an embodiment. FIG. 6 is a diagram illustrating an enlarged area illustrated in FIG. 5 according to an embodiment. FIG. 7 is an enlarged view illustrating the section A and the section B illustrated in FIG. 6 according to an embodiment. FIG. 8 is a diagram illustrating a second substrate.

Referring to FIG. 5, the first substrate 20 may be a wafer, and a plurality of LEDs 21 may be formed on the first substrate 20.

The plurality of LEDs 21 may exhibit different performance from one another based on processing conditions, manufacturing tolerance, and the manufacturing environment of the first substrate 20. For example, and referring to FIG. 5, the performance (e.g., color, luminance, etc.) of the LEDs 21 may be greater towards a center of the first substrate 20 than as compared to an outer edge of the first substrate 20.

In FIG. 5, performance distribution of the plurality of LEDs 21 formed on the first substrate 20 is expressed in the form of gradation. In FIG. 5, performance distribution of LEDs 21 in each area of the first substrate 20 is expressed as a plurality of square shapes of which sizes gradually increase radially from the square shape indicated in the center portion of the first substrate 20, but this is merely for convenience of explanation, and performance distribution of LEDs 21 on the first substrate 20 may be expressed as gradation in the form of a circle, an oval, or an atypical looped curve. Also, an area wherein performance of LEDs 21 is above a threshold may not necessarily belong to the center portion of the first substrate 20, but may be located toward a side of the first substrate 20.

The first substrate 20 may be divided into a plurality of virtual areas for transferring a plurality of LEDs 21 to the second substrate 30 as shown in FIG. 5. Division of such virtual areas may be performed by a vision camera (not shown) and the processor 80 that may be provided in the LED transfer device 1 according to the disclosure. In this case, information associated with the virtual areas of the first substrate 20 and information identifying the coordinates of the plurality of LEDs 21 arranged in each virtual area may be stored in the memory 70.

FIG. 6 illustrates the first area as shown in FIG. 5. FIG. 6 is a top view of the first substrate 20, and depicts a top surface of the first substrate 20. Referring to FIG. 1, the top surface of the first substrate 20 may face toward the laser light source 60, and a bottom surface of the first substrate 20 may face toward the second substrate 30. The LEDs 21 are shown in solid lines in FIG. 6 instead of broken lines, but it should be understood that the LEDs 21 are disposed on the bottom surface of the first substrate 20.

Referring to FIG. 6, in the first area, LEDs 21 having the highest performance may be located in in the upper left corner of the first substrate 20 shown in FIG. 6 (e.g., which corresponds to a center of the first substrate 20 shown in FIG. 5), and LEDs 21 having the lowest performance may be located in the bottom right corner of the first substrate 20 shown in FIG. 6 (e.g., which corresponds to a bottom left corner shown in FIG. 5). The performance of the LEDs 21 may gradually decrease from the top left corner toward the bottom right corner as shown in FIG. 6.

Also, as shown in FIG. 6, in the first area, anodes and cathodes of a first subset of LEDs 21*a* and anodes and cathodes of a second subset of LEDs 21*b* among a plurality of LEDs 21 may be formed to be oppositely arranged to one another.

In a case where the electrodes of the LEDs 21*a* and 21*b* are respectively arranged at 0 degrees and 180 degrees, as above, all of the anode pads 31*a* and the cathode pads 31*b* of the second substrate 30 may be set in the same direction (e.g., 0 degrees), as shown in FIG. 8.

In FIG. 8, and referring to LEDs 21 transferred on the second substrate 30, three LEDs 21 which are red (R), green (G), and blue (B) LEDs 21, respectively, constitute a single pixel. Accordingly, the anode pads 31*a* and the cathode pads 31*b* arranged on the second substrate 30 may be arranged such that three pairs of electrode pads are arranged to be adjacent to each other, and other pixels arranged around the pixel may be arranged at a specific interval from the pixel.

Hereinafter, an LED transferring method according to an embodiment will be explained with reference to FIGS. 9 to 13.

Figure 9:
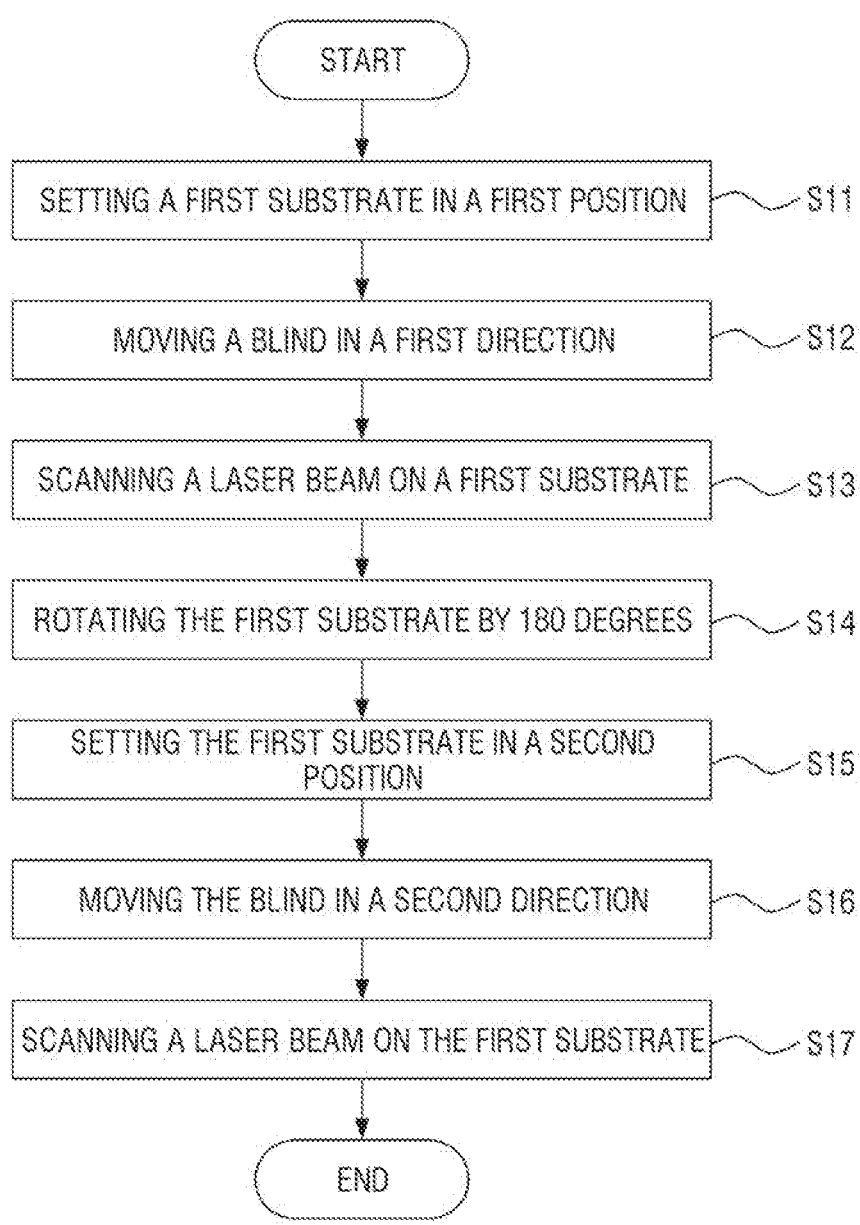
FIG. 9 is a flow chart illustrating a process of transferring a plurality of LEDs from the first substrate to the second substrate by using an LED transfer device according to an embodiment.
Figure 11:
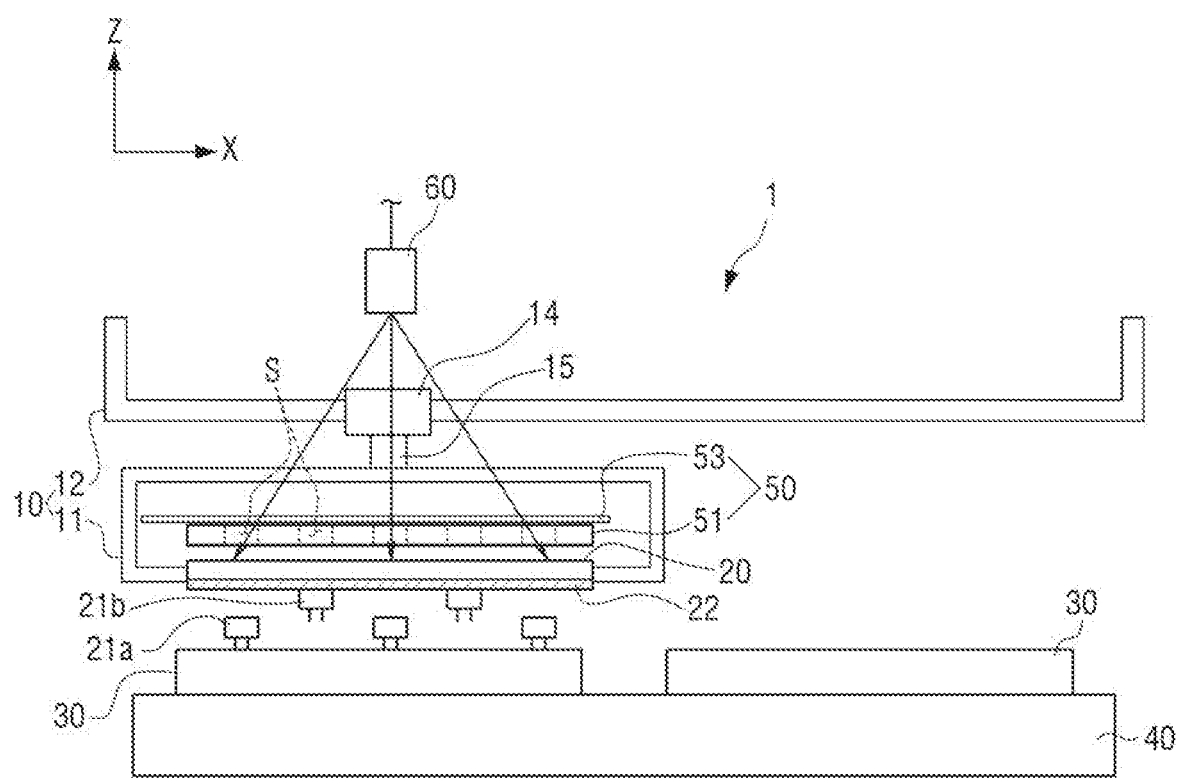
FIG. 11 is a diagram illustrating an example of radiating a laser beam toward the first substrate through the opening of the mask illustrated in FIG. 10 according to an embodiment.
Figure 12:
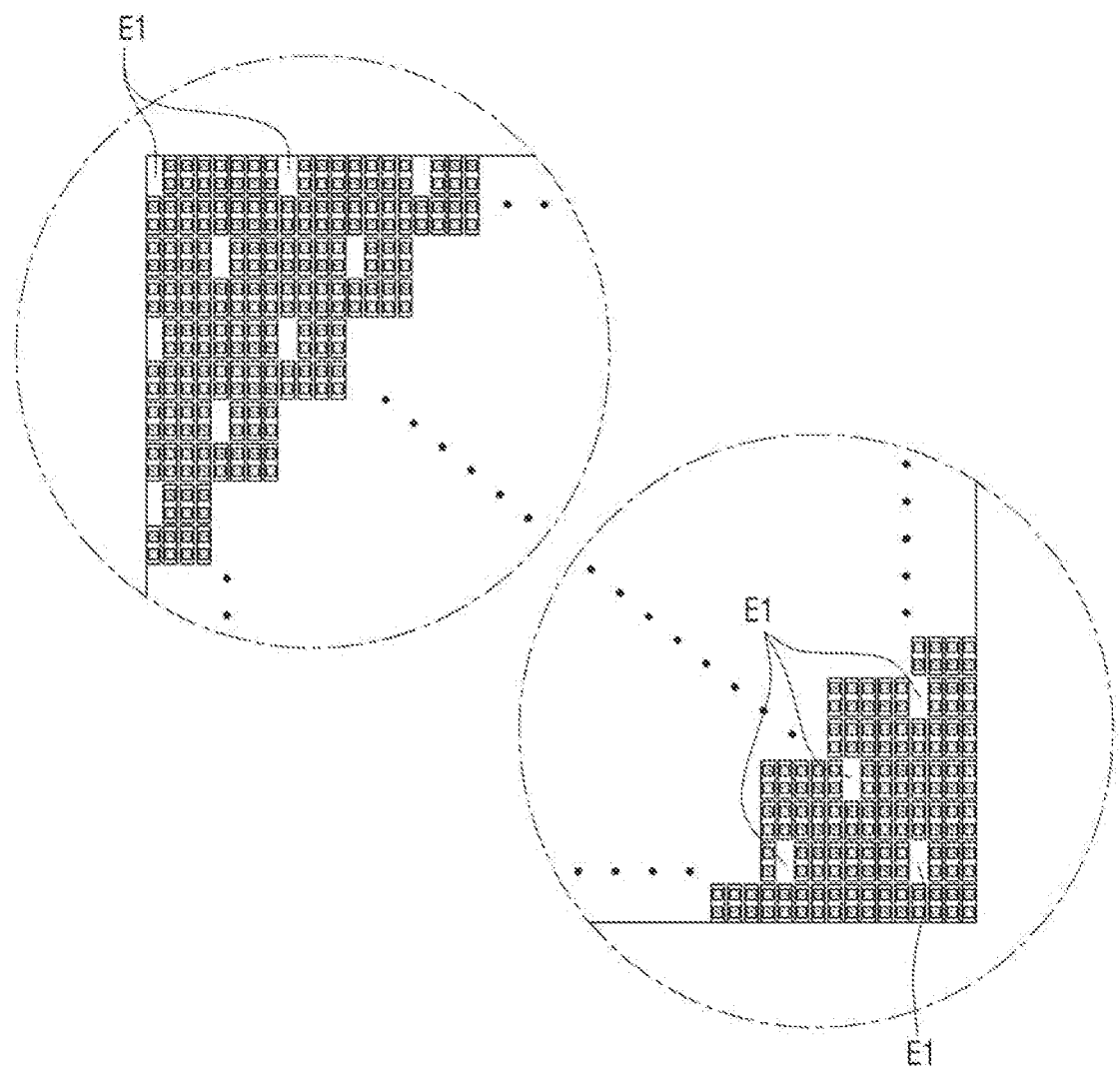
FIG. 12 is a diagram illustrating an example wherein a subset of LEDs have been separated from the first area by laser transfer while the first substrate is set in a first position according to an embodiment.
Figure 13:
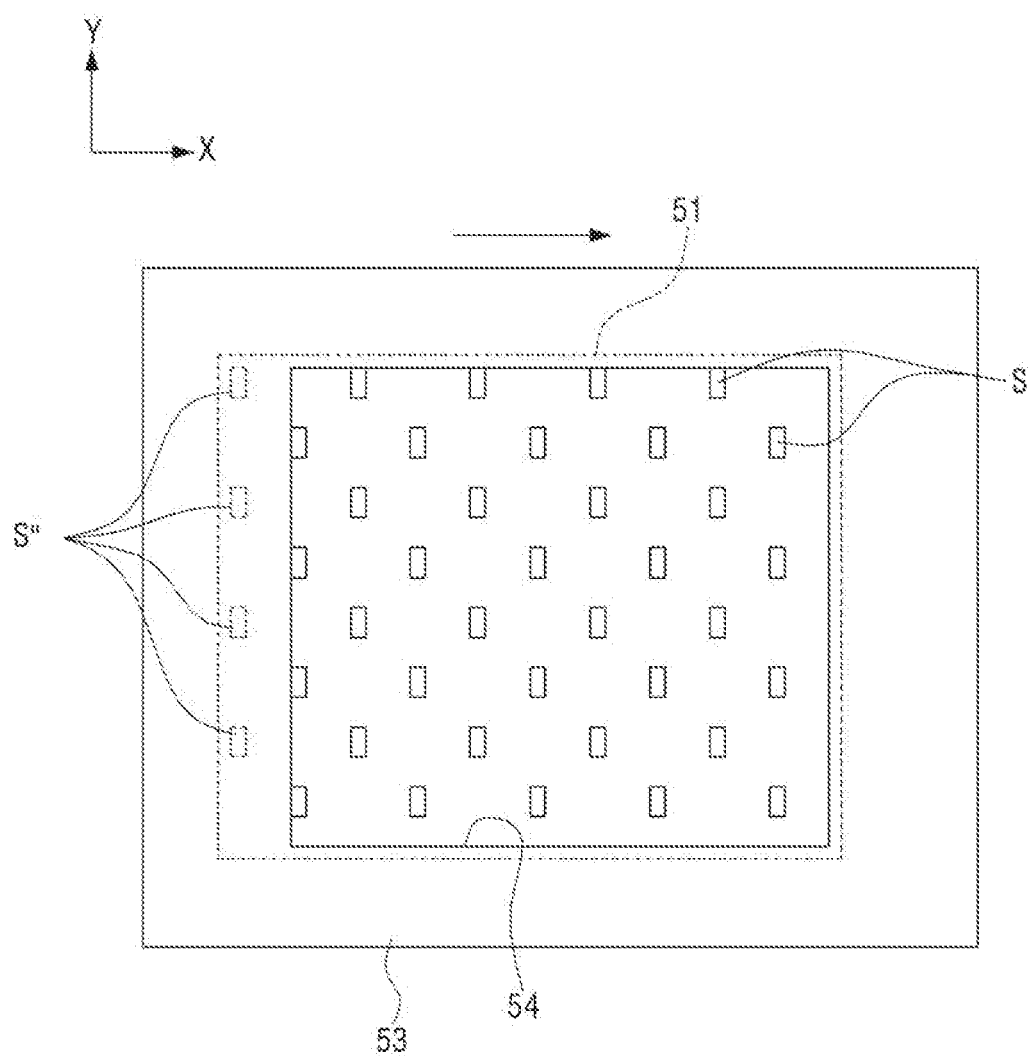
FIG. 13 is a diagram illustrating a state wherein the blind of the mask is moved to the right side with respect to the mask according to an embodiment.
Figure 14:
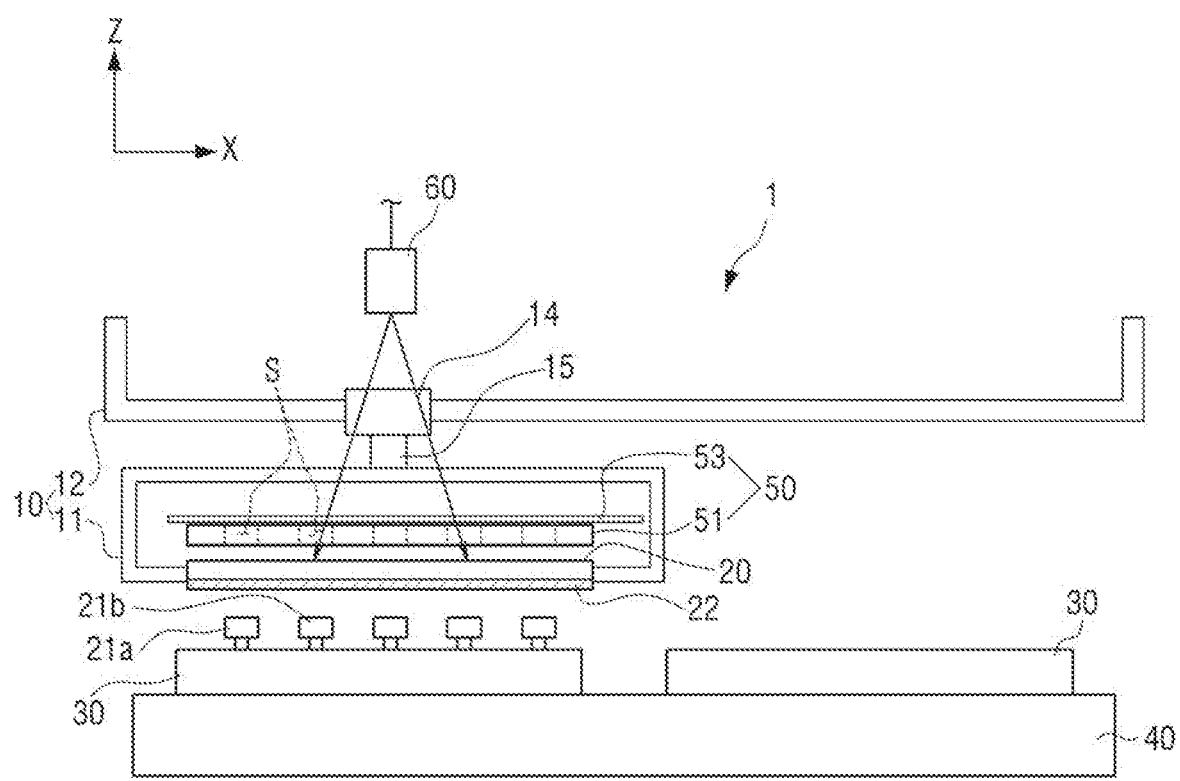
FIG. 14 is a diagram illustrating an example of radiating a laser beam toward the first substrate through the opening of the mask illustrated in FIG. 13 according to an embodiment.
Figure 15:
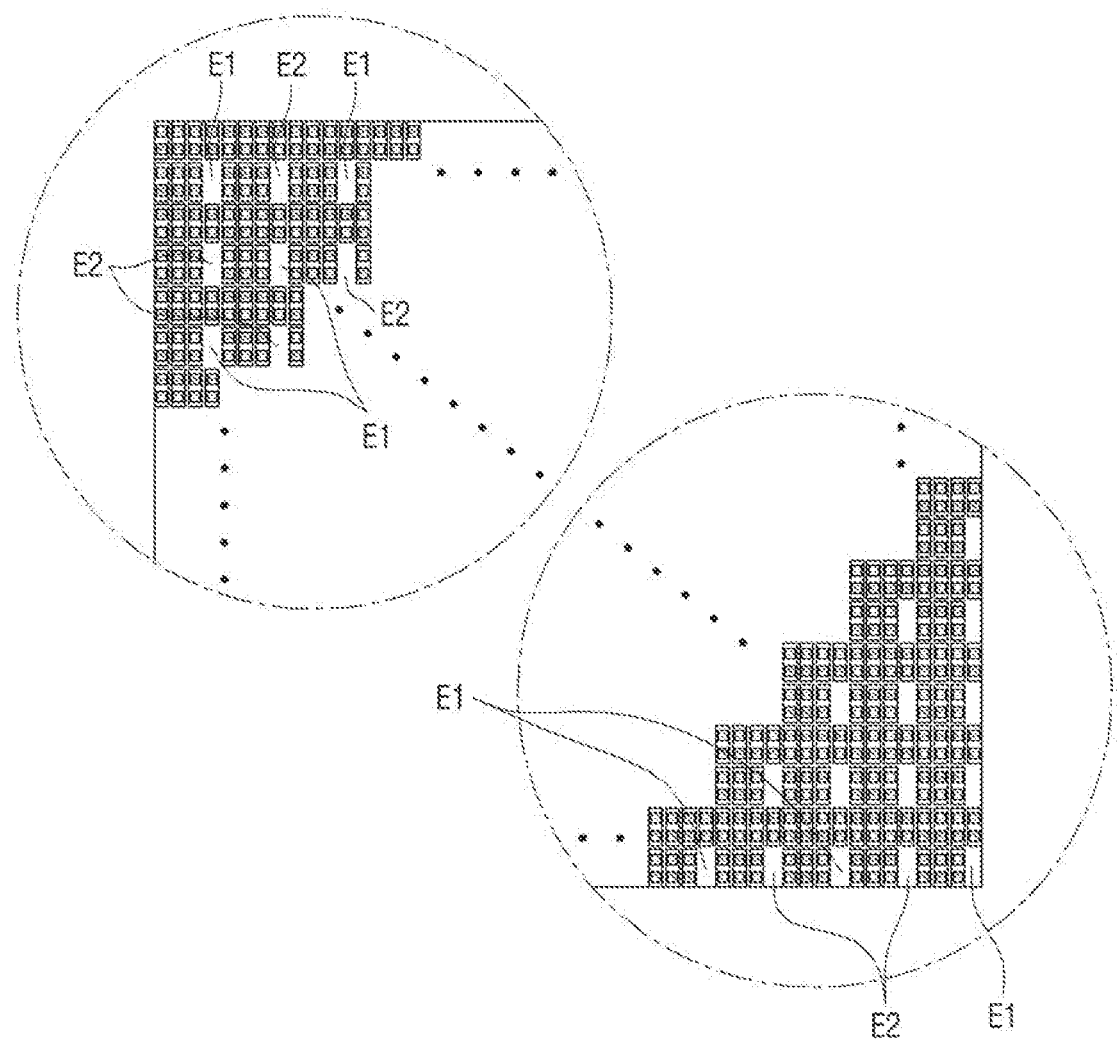
FIG. 15 is a diagram illustrating an example wherein a subset of LEDs have been separated from the first area by laser transfer while the first substrate is set in a second position according to an embodiment.

FIG. 9 is a flow chart illustrating a process of transferring a plurality of LEDs from the first substrate to the second substrate by using an LED transfer device according to an embodiment. FIG. 10 is a diagram illustrating a state wherein a blind is moved to a left side with respect to the mask according to an embodiment. FIG. 11 is a diagram illustrating an example of radiating a laser beam toward the first substrate through the opening of the mask illustrated in FIG. 10 according to an embodiment. FIG. 12 is a diagram illustrating an example wherein a subset of LEDs have been separated from the first area by laser transfer while the first substrate is set in a first position according to an embodiment. FIG. 13 is a diagram illustrating a state wherein the blind of the mask is moved to the right side with respect to the mask according to an embodiment. FIG. 14 is a diagram illustrating an example of radiating a laser beam toward the first substrate through the opening of the mask illustrated in FIG. 13 according to an embodiment. FIG. 15 is a diagram illustrating an example wherein a subset of LEDs have been separated from the first area by laser transfer while the first substrate is set in a second position according to an embodiment.

First, the first substrate 20 is connected to the fixing member 11 of the transfer assembly 10 such that a plurality of LEDs 21 are disposed toward and face the top surface of the second substrate 30. The second substrate 30 may be provided on the stage 40 such that the anode pad 31*a* and the cathode pad 31*b* are disposed toward and face the plurality of LEDs 21. In this state, the first substrate 20 may be set in the first position by the transfer assembly 10 at operation S11 of FIG. 9.

In this case, the first and second substrates 20 and 30 may be arranged in parallel. Also, the interval in the Z-axis direction between the LEDs 21 of the first substrate 20 and the transfer surface of the second substrate 30 may be maintained such that a plurality of LEDs 21 may be transferred to the second substrate 30 via laser transfer in a stable manner. The interval may be 10 micrometers, 50 micrometers, 100 micrometers, etc.

When the first substrate 20 is set in the first position, the first area of the first substrate 20 and the area to which LEDs 21 will be transferred (hereinafter referred to as a "transfer area") on the second substrate 30 may be arranged in positions facing each other. The transfer area of the second substrate 30 may be divided in identical or similar sizes to the first area of the first substrate, but is not limited thereto, and may be divided in various sizes.

Referring to FIG. 10, the blind 53 may move by a certain distance in the first direction (toward the left side along the X-axis direction) while the first substrate 20 is set in the first position at operation S12 of FIG. 9. When the blind 53 moves in the first direction as described above, the openings S' arranged in the rightmost column among the openings S of the mask 51 may be blocked by the blind 53, and the other openings S and S" of the mask 51 may be exposed.

Each of the openings S and S" of the mask 51 exposed by the blind 53 are in positions corresponding to LEDs 21 to be transferred in the first area of the first substrate 20. Also, the LEDs 21 in the first area corresponding to each opening of the mask 51 may respectively be set in positions corresponding to the transfer area of the second substrate 30. That is, with respect to a single exposed opening, the position of the LED 21 of the first substrate and the position of the second substrate to which the LED 21 will be transferred may be located on the same vertical line.

In a state as mentioned above, the laser light source 60 radiates a laser beam toward the first substrate 20 via a plurality of exposed openings S as shown in FIG. 11 at operation S13 of FIG. 9.

Heat of the laser beam may be transferred to the adhesive layer 22 arranged between the LEDs 21 and the first substrate 20. As the adhesive force of the adhesive layer 22 is reduced by the heat, the LEDs 21*a* of the first group G1 may be separated from the first substrate 20 and transferred to the transfer area of the second substrate 30.

The plurality of LEDs 21*a* transferred from the first area of the first substrate 20 to the transfer area of the second substrate 30 may be arranged on virtual diagonal lines at certain intervals as illustrated in FIG. 7. The plurality of LEDs 21*a* may be defined as the first group G1.

The anode and the cathode of each of the LEDs 21*a* of the first group G1 transferred to the second substrate 30 may be physically and electrically connected to the anode pad 31*a* and the cathode pad 31*b* of the second substrate 30. In this case, the anode pad 31*a* and the cathode pad 31*b* of the second substrate 30 may be transformed into a molten state from a solid state by the laser beam and may be connected to the anodes and the cathodes of the LEDs 21*a* of the first group G1.

The first area of the first substrate 20 after the LEDs 21*a* of the first group G1 are transferred is illustrated in FIG. 12. In FIG. 12, the reference numeral E1 indicates empty spaces that are generated as the plurality of LEDs 21*a* belonging to the first group G1 are separated from the first area. The empty spaces E1 are located on virtual diagonal lines arranged to have certain intervals as similar to the plurality of LEDs 21 of the first group G1 as shown in FIG. 7.

After the LEDs 21*a* of the first group G1 are transferred, when the fixing member 11 is rotated by 180 degrees via the rotation member 15 about the Z-axis, the first substrate 20 rotates by 180 degrees together with the fixing member 11 at operation S14 of FIG. 9.

If the first substrate 20 rotates by 180 degrees as mentioned above, performance distribution of the LEDs 21 is changed. That is, the location of the upper left corner that includes LEDs 21 having the highest performance is changed to the bottom right corner, and the location of the bottom right corner that includes LEDs 21 having the lowest performance is changed to the upper left corner.

Then, the first substrate 20 is moved along the X-Y plane via the transfer assembly 10 and the position of the first substrate 20 is set in the second position at operation S15 of FIG. 9. The second position may be a position wherein the plurality of LEDs 21*b* belonging to the second group G2 among the plurality of LEDs 21 on the first substrate 20 may be transferred to the transfer area of the second substrate 30.

Referring to FIG. 13, the blind 53 may move by a certain distance in the second direction (toward the right side along the X-axis direction) while the first substrate 20 is set in the second position at operation S16 of FIG. 9.

When the blind 53 moves in the second direction as described above, the openings S" arranged in the leftmost column among the openings of the mask 51 may be blocked by the blind 53, and the openings S and S' of the mask 51 may be exposed. Each of the openings S and S' of the mask 51 exposed by the blind 53 includes a position corresponding to LEDs 21 to be transferred in the first area of the first substrate 20. Also, the LEDs 21 in the first area corresponding to each opening of the mask 51 may respectively be set in positions corresponding to the transfer area of the second substrate 30.

Referring to FIG. 14, the laser light source 60 radiates a laser beam toward the first substrate 20 through the plurality of exposed openings S of the mask 51 by the blind 53 at operation S17 of FIG. 9.

The plurality of LEDs 21*b* on the first substrate 20 may be separated from the adhesive layer 22 by a laser beam radiated toward the first substrate 20 and may be transferred to the transfer area of the second substrate 30.

The first area of the first substrate 20 after the LEDs 21*b* of the second group G2 are transferred is illustrated in FIG. 15. In FIG. 15, the reference numeral E2 indicates empty spaces that are generated as the plurality of LEDs 21*b* belonging to the second group G2 are separated from the first area. The empty spaces E2 are located on virtual diagonal lines arranged to have certain intervals similar to the plurality of LEDs 21*b* of the second group G2 as shown in FIG. 7.

As described above, the plurality of LEDs 21 formed on the first substrate 20 may exhibit different performance. Accordingly, transfer is performed while the first substrate 20 is alternatingly rotated between 0 degrees and 180 degrees so that the locations of areas having LEDs 21 having high performance and the locations of areas having LEDs 21 having low performance are changed. Accordingly, a plurality of LEDs 21 may be transferred in a manner that permits a display to exhibit more uniform performance distribution.

By repeating the aforementioned transfer process, the plurality of LEDs 21 arranged in the remaining divided areas of the first substrate 20 may be transferred to the second substrate 30.

Figure 17:
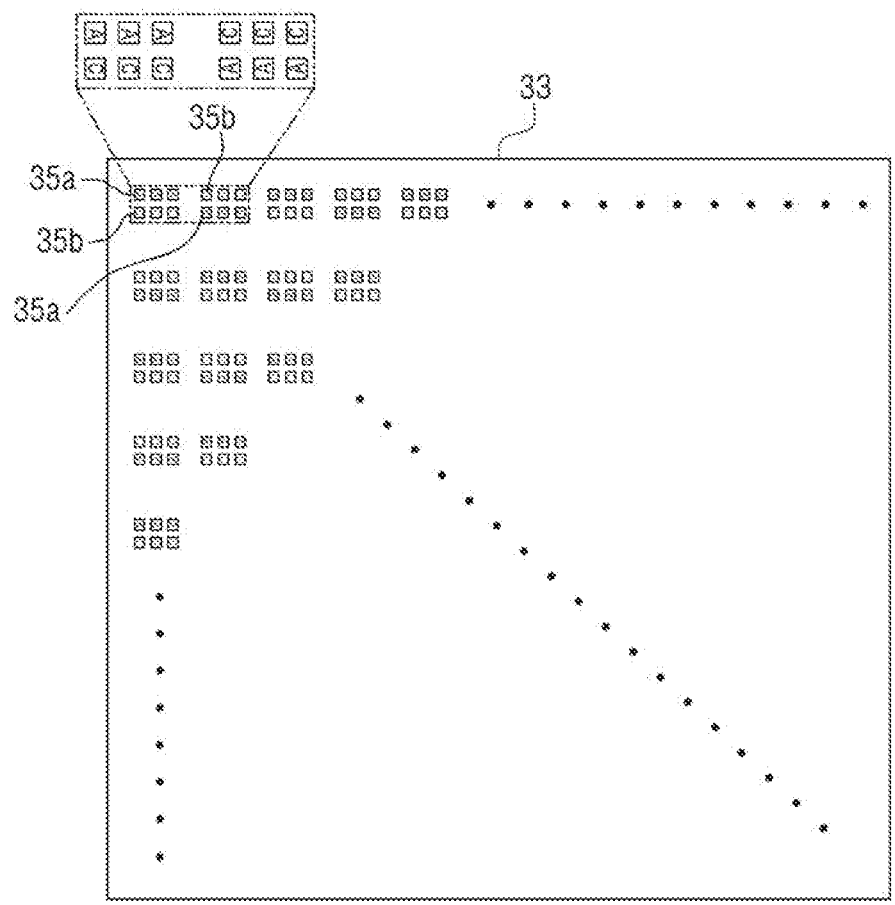
FIG. 17 is a diagram illustrating another example of the second substrate according to an embodiment.

FIG. 16 is a diagram illustrating another example of the first substrate, and FIG. 17 is a diagram illustrating another example of the second substrate.

On the first substrate 20 used in the aforementioned LED transferring method according to an embodiment, anodes and cathodes of a plurality of LEDs 21 are arranged in opposite directions to one another. That is, a plurality of LEDs 21 having a first electrode arrangement (0 degrees) and a second electrode arrangement (180 degrees) are arranged based on a predetermined condition.

However, in the LED transferring method according to an embodiment, a first substrate 20 on which a plurality of LEDs 21 are arranged only in a first electrode arrangement (or a second electrode arrangement) may be used as shown in FIG. 16.

In this case, on the second substrate 33, an anode pad 35a and a cathode pad 35b in a first arrangement are formed, and an anode pad 35a and a cathode pad 35b in a second arrangement are formed as shown in FIG. 17. If the first arrangement is set as 0 degrees as above, the second arrangement may be set as 180 degrees which is opposite to the first arrangement.

Figure 18:
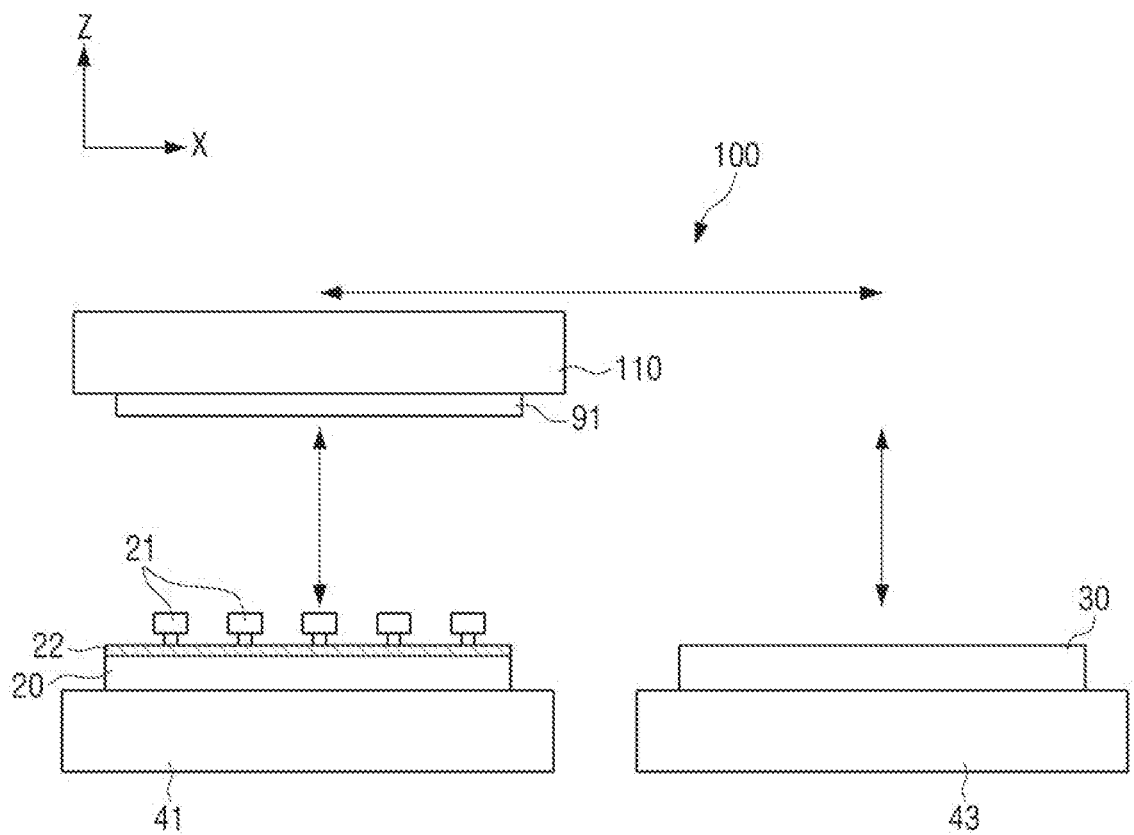
FIG. 18 is a schematic diagram illustrating an LED transfer device according to another embodiment.
Figure 19:
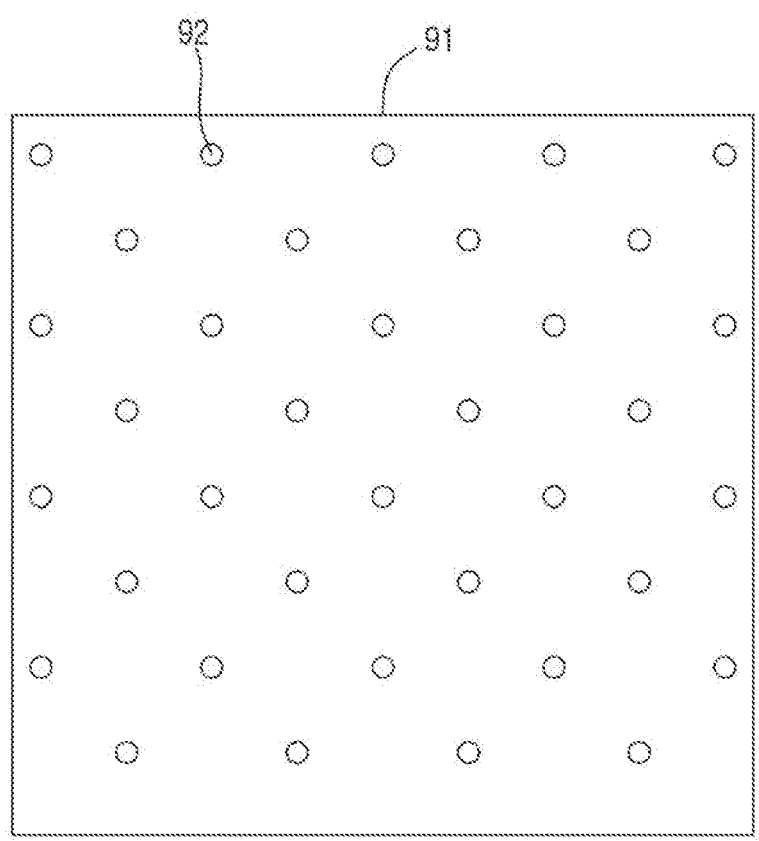
FIG. 19 is a diagram illustrating a first picker for picking a plurality of LEDs according to an embodiment.
Figure 20:
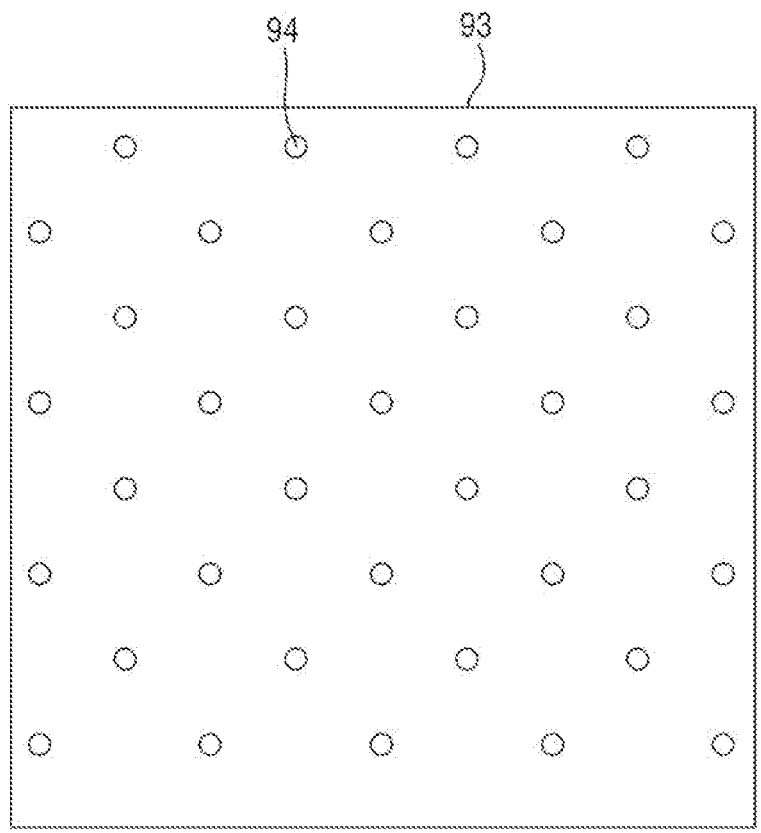
FIG. 20 is a diagram illustrating a second picker for picking a plurality of LEDs according to an embodiment.

FIG. 18 is a schematic diagram illustrating an LED transfer device according to another embodiment, and FIGS. 19 and 20 are diagrams respectively illustrating a first picker and a second picker for picking a plurality of LEDs.

Referring to FIG. 18, the LED transfer device 110 according to another embodiment may be a device which transfers the LEDs 21 of the first substrate 20 to the second substrate 30 by a pick and place method.

The first substrate 20 may be provided on the first stage 41, and the second substrate 30 may be provided on the second stage 43 adjacent to the first stage 41.

An adhesive layer 22 for separating the LEDs 21 from the first substrate 20 may be formed on the first substrate 20.

The anodes and the cathodes of each of the plurality of LEDs 21 may be adhered to the adhesive layer 22.

The first stage 41 may move to a random location on the X-Y plane by a driving device which is not illustrated, and may rotate in a clockwise direction and a counterclockwise direction about the Z-axis. Accordingly, the first substrate 20 provided on the first stage 41 may move along the X-Y plane, and rotate between 0 degrees and 180 degrees.

The LED transfer device 100 according to another embodiment may include a first picker 91 and a second picker 93 for picking and placing LEDs 21.

Referring to FIGS. 19 and 20, the first picker 91 may be mounted on the head of the driving device (not shown) and move in the X-axis, Y-axis, and Z-axis directions. A plurality of picking parts 92 may be provided at certain intervals on the bottom surface of the first picker 91. The arrangement of the plurality of picking parts 92 may correspond to the arrangement of the plurality of openings S of the mask 51 exposed through the exposure hole 54 of the blind 53 illustrated in FIG. 10.

Referring to FIG. 20, the second picker 93 may be mounted on the head (not shown) of a driving device (not shown) different from the driving device driving the first picker 91 and move in the X-axis, Y-axis, and Z-axis directions. A plurality of picking parts 94 may be provided at certain intervals on the bottom surface of the second picker 93. The arrangement of the plurality of picking parts 94 may correspond to the arrangement of the plurality of openings S of the mask 51 exposed through the exposure hole 54 of the blind 53 illustrated in FIG. 13.

The first and second pickers 91 and 93 may be driven by separate driving devices, but are not limited thereto, and they may be constituted to be simultaneously mounted on a head provided on a single driving device. In this case, it may be preferable that the operations of the first and second pickers 91 and 93 are performed separately from elevating operations. That is, when the first picker 91 descends for picking and placing, the second picker 93 does not descend, and alternatively, when the second picker 93 descends for picking and placing, the first picker 91 does not descend.

Hereinafter, a transferring method using an LED transfer device according to another embodiment will be explained with reference to FIG. 21.

Figure 21:
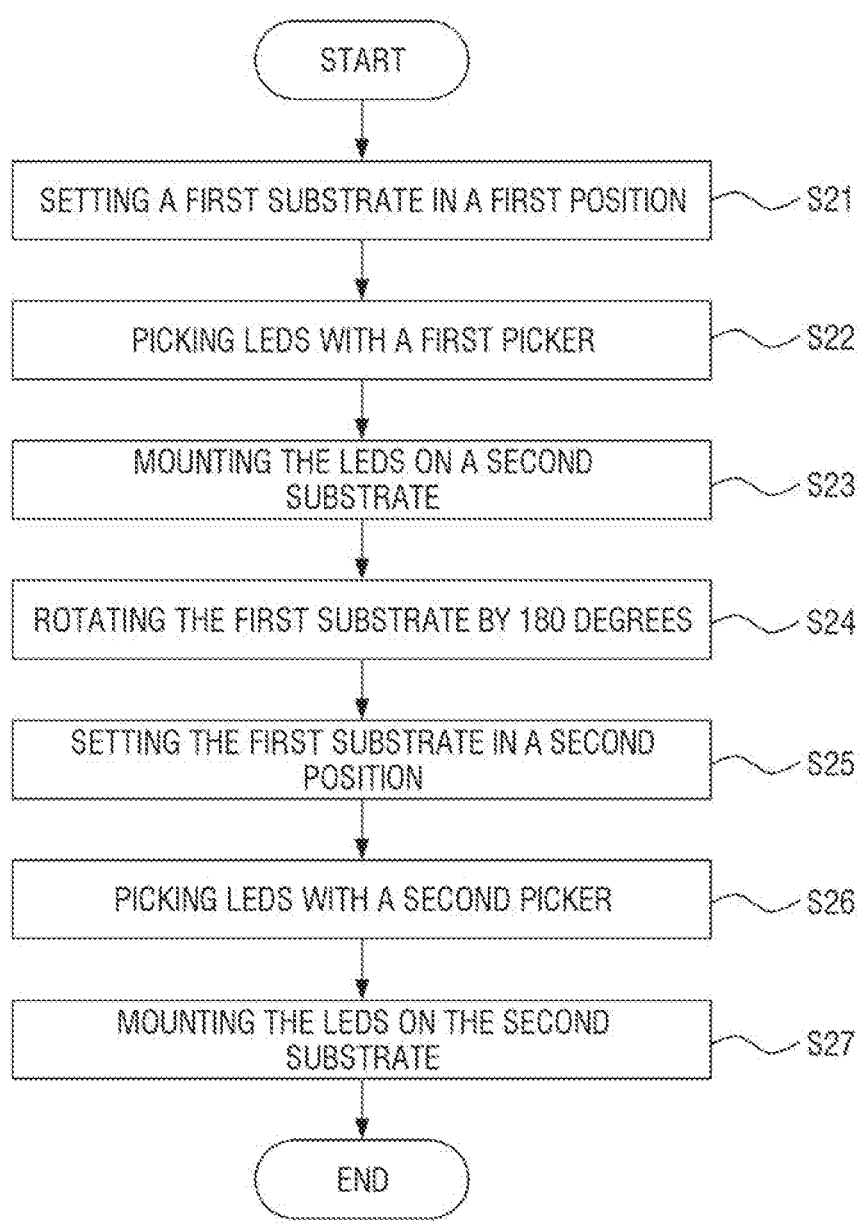
FIG. 21 is a flow chart illustrating a process of transferring a plurality of LEDs from the first substrate to the second substrate by using an LED transfer device according to another embodiment.

FIG. 21 is a flow chart illustrating a process of transferring a plurality of LEDs from the first substrate to the second substrate by using an LED transfer device according to another embodiment. In a case where the LEDs 21 on the first substrate 20 are transferred to the second substrate 30 by a pick and place method, a plurality of virtual areas may be defined on the first substrate 20 and the LEDs 21 may be transferred to the transfer area of the second substrate 30 corresponding to each area of the first substrate 20. As can be seen above, in a pick and place method, LEDs 21 may also be transferred for each area in a similar manner as compared to the LED transferring method by the aforementioned laser transfer method.

First, the first substrate 20 is provided on the first stage 41 such that the plurality of LEDs 21 are facing upward, and is set in a first position at operation S21. Further, the second substrate 30 is provided on the second stage 43 such that the anode pad and the cathode pad are facing upward.

In this state, the first picker 91 moves above the first substrate 20 and is set in the first position such that the plurality of picking parts 92 correspond to the plurality of LEDs 21 which are to be picked, so that the plurality of LEDs 21 can be picked simultaneously.

When the first picker 91 is set in the first position, the first picker 91 is descended and the plurality of LEDs 21 of the first group G1 on the first substrate are picked at operation S22.

In this state, the first picker 91 is ascended to a certain height, and is then moved to the transfer position of the second substrate 30. Then, the first picker 91 is descended and the plurality of LEDs 21 are mounted on the transfer area of the second substrate 30 at operation S23.

The first picker 91 ascends and moves to a predetermined standby position for picking the plurality of LEDs 21 from the first substrate 20 again.

The first stage 41 rotates the first substrate 20 by 180 degrees at operation S24. When the first substrate 20 rotates by 180 degrees as mentioned above, performance distribution of the LEDs 21 changes. That is, the location of LEDs 21 having the highest performance may be changed, and the location of LEDs 21 having the lowest performance may be changed.

After the first substrate 20 rotates by 180 degrees, the first substrate 20 is set in a second position at operation S25. Then, the second picker 93 moves above the first substrate 20 and is set in the second position different from the first position such that the plurality of picking parts 94 correspond to the plurality of LEDs 21 which are to be picked so that the plurality of LEDs 21 can be picked simultaneously.

When the second picker 93 is set in the second position, the second picker 93 is descended and the plurality of LEDs 21 of the second group G2 on the first substrate 20 are picked at operation S26.

In this state, the second picker 93 is ascended to a certain height, and is then moved to the transfer position of the second substrate 30. Then, the second picker 93 is descended and the plurality of LEDs 21 are mounted on the transfer area of the second substrate 30 at operation S27.

The second picker 93 ascends and moves to a predetermined standby position for picking the plurality of LEDs 21 from the first substrate 20 again. The first stage 41 rotates by 180 degrees again for positioning the first substrate 20 to the first position.

In the LED transferring method according to another embodiment, the aforementioned transfer process is repeatedly performed, and the plurality of LEDs 21 arranged in the remaining divided areas of the first substrate 20 may thereby be transferred to the second substrate 30.

According to the aforementioned LED transferring method through a pick and place method, the first substrate 20 is alternatingly rotated between 0 degrees and 180 degrees for changing the arrangement of performance distribution of the LEDs 21 on the first substrate 20. However, the arrangement of performance distribution of the LEDs 21 on the first substrate 20 may be changed without rotating the first substrate 20.

Figure 22:
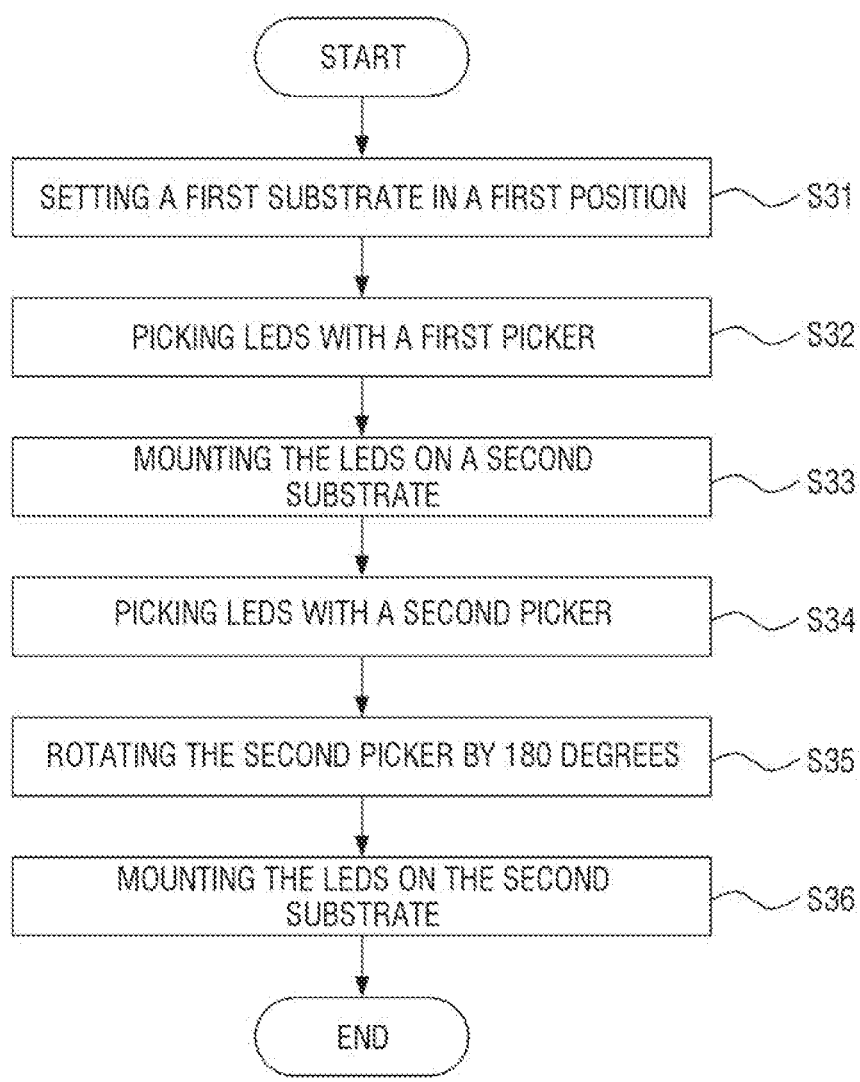
FIG. 22 is a flow chart illustrating a process of transferring a plurality of LEDs from the first substrate to the second substrate by using an LED transfer device according to another embodiment.

FIG. 22 is a flow chart illustrating a process of transferring a plurality of LEDs from the first substrate to the second substrate by using an LED transfer device according to another embodiment.

As shown in FIG. 22, the first substrate 20 may be set in a first position at operation S31. Then, the first picker 91 may pick LEDs 21 from the first substrate, based on the first substrate being set in the first position at operation S32. Then, the first picker 91 may mount the LEDs 21 on a second substrate 30 at operation S33.

After a picking and placing operation is performed by the first picker 91, the first substrate 20 may remain stationary. The second picker 93 may pick the plurality of LEDs 21 from the first substrate 20 at operation S34, rotate by 180 degrees at operation S35, and then place the plurality of LEDs 21 on the second substrate 30 at operation S36. After the placing operation, the second picker 93 may rotate by 180 degrees again and move to a standby position.

The LED transferring methods according to the aforementioned various embodiments may be implemented in the forms of applications that may be installed on LED transfer devices.

Also, methods according to the aforementioned various embodiments may be implemented via software upgrade, or hardware upgrade of LED transfer devices.

In addition, the aforementioned various embodiments may be performed by an embedded server provided in an LED transfer device, or an external server of an LED transfer device.

The aforementioned various embodiments may be implemented by a computer configured to execute instructions stored on a non-transitory computer-readable recording medium that can be read by the computer or a device similar to a computer, by using software, hardware, or a combination thereof. In some cases, the embodiments described in this specification may be implemented by the processor 80. According to implementation by software, the embodiments such as processes and functions described in this specification may be implemented by separate software modules. Each of the software modules may perform one or more functions and operations described in this specification.

Computer instructions for performing processing operations of the LED transfer device 1 according to the aforementioned various embodiments may be stored in a non-transitory computer-readable medium. Computer instructions stored in such a non-transitory computer-readable medium render the processing operations of the LED transfer device 1 according to the aforementioned various embodiments performed by a specific machine, when the instructions are executed by the processor of the specific machine.

A non-transitory computer-readable medium refers to a medium that stores data semi-permanently, and is readable by machines. As specific examples of a non-transitory computer-readable medium, there may be a compact disc (CD), a digital versatile disc (DVD), a hard disc, a blue-ray disc, a universal serial bus (USB) drive, a memory card, a ROM, and the like.

Also, while the various embodiments have been described separately from one another, the embodiments do not have to be implemented independently, but the configuration and operation of each embodiment may be implemented in combination with at least one other embodiment.

In addition, while embodiments have been shown and described, the disclosure is not limited to the aforementioned specific embodiments, and it should be apparent that various modifications may be made by those having ordinary skill in the technical field to which the disclosure belongs, without departing from the scope and spirit of the disclosure as claimed by the appended claims. Also, it is intended that such modifications are not to be interpreted independently from the technical idea or spirit of the disclosure.

What is claimed is:

1. A light-emitting diode (LED) transfer device comprising:
a transfer assembly configured to move a first substrate, on which a plurality of LEDs are provided, above a second substrate;
a laser light source configured to emit a laser beam toward the first substrate;
a mask that is disposed between the first substrate and the laser light source and has a plurality of openings that are configured to be selectively exposed and blocked; and
a processor configured to:
control the transfer assembly to move the first substrate to a predetermined position and selectively rotate the first substrate; and
control the mask to expose and block the plurality of openings corresponding to the plurality of LEDs to be transferred from the first substrate to the second substrate.

2. The LED transfer device of claim 1, wherein the processor is further configured to control the transfer assembly to rotate the first substrate in a first direction and a second direction which is opposite to the first direction such that output characteristics among a plurality of transfer areas of the second substrate on which the plurality of LEDs are transferred are substantially uniform.

3. The LED transfer device of claim 2, wherein the mask comprises a blind which is configured to be selectively changed between a first mode and a second mode,
wherein in the first mode, first openings among the plurality of openings are opened, the first openings corresponding to a first group of LEDs, among the plurality of LEDs, to be arranged on the second substrate, and
in the second mode, second openings among the plurality of openings opened, the second openings corresponding to a second group of LEDs, among the plurality of LEDs, to be arranged on the second substrate between the first group of LEDs.

4. The LED transfer device of claim 3, wherein the processor is further configured to:
  based on the blind being in the first mode, control the transfer assembly to set the first substrate in a first position; and
  based on the blind being in the second mode, control the transfer assembly to set the first substrate in a second position different from the first position.

5. The LED transfer device of claim 4, wherein the second position is rotated by 180 degrees with respect to the first position.

6. The LED transfer device of claim 1, further comprising an adhesive layer provided between each of the plurality of LEDs and the first substrate, and
  wherein the laser beam transfers heat to the adhesive layer and separates the plurality of LEDs from the first substrate.

7. The LED transfer device of claim 3, wherein the first group of LEDs and the second group of LEDs are arranged in parallel in a diagonal direction on the first substrate.

8. The LED transfer device of claim 3, wherein the first group of LEDs and the second group of LEDs are arranged in parallel in a diagonal direction on the second substrate.

9. The LED transfer device of claim 3, wherein the LEDs of the first group of LEDs include first anodes and first cathodes,
  wherein the LEDs of the second group of LEDs include second anodes and second cathodes that are rotated 180 degrees with respect to the first anodes and the first cathodes, and
  wherein first anode pads and first cathode pads are provided on the second substrate to which the first group of LEDs are transferred and are arranged in a same direction as second anode pads and second cathode pads on the second substrate to which the second group of LEDs are transferred.

10. The LED transfer device of claim 3, wherein the LEDs of the first group of LEDs include first anodes and first cathodes,
  wherein the LEDs of the second group of LEDs include second anodes and second cathodes, and
  wherein first anode pads and first cathode pads are provided on the second substrate to which the first group of LEDs are transferred and are rotated by 180 degrees with respect to second anode pads and second cathode pads on the second substrate to which the second group of LEDs are transferred.

11. A light-emitting diode (LED) transfer device comprising:
  a first stage configured to support a first substrate on which a plurality of LEDs are provided;
  a second stage configured to support a second substrate;
  a first picker configured to pick a first group of LEDs among the plurality of LEDs from the first substrate, and place the first group of LEDs on the second substrate;
  a second picker configured to pick a second group of LEDs among the plurality of LEDs from the first substrate, and place the second group of LEDs on the second substrate, the second group of LEDs being different from the first group of LEDs; and
  a processor configured to control the first picker and the second picker to place the first group of LEDs and the second group of LEDs on the second substrate in an alternating manner such that the first group of LEDs is rotated by 180 degrees with respect to the second group of LEDs.

12. The LED transfer device of claim 11, wherein the first picker comprises a plurality of first picking parts configured to pick the first group of LEDs from the first substrate, and
  wherein the second picker comprises a plurality of second picking parts configured to pick the second group of LEDs from the first substrate.

13. The LED transfer device of claim 11, wherein the first picker and the second picker are respectively driven by different driving devices.

14. The LED transfer device of claim 11, wherein the first picker and the second picker are driven by a single driving device, and are connected to a head of the single driving device.

15. The LED transfer device of claim 14, wherein the first picker and the second picker are connected together via the head, and
  wherein an elevating operation of the first picker is performed in an opposite manner as an elevating operation of the second picker.

16. The LED transfer device of claim 11, wherein the first substrate further comprises an adhesive layer formed between each of the plurality of LEDs and the first substrate such that the plurality of LEDs can be picked from the first substrate by the first picker and the second picker, and
  wherein anodes and cathodes of each of the plurality of LEDs are attached to the adhesive layer.

17. A light-emitting diode (LED) transferring method comprising:
  providing a first substrate in a first position;
  transferring a first group of LEDs among a plurality of LEDs on the first substrate to a second substrate;
  rotating the first substrate in a first direction by 180 degrees;
  moving the first substrate to a second position that is different from the first position; and
  transferring a second group of LEDs among the plurality of LEDs on the first substrate to the second substrate; and
  after transferring the second group of LEDs to the second substrate, rotating the first substrate in a second direction that is opposite to the first direction by 180 degrees.

18. A non-transitory computer-readable medium including a program for executing a light-emitting diode (LED) transferring method, the LED transferring method comprising:
  providing a first substrate in a first position;
  transferring a first group of LEDs among a plurality of LEDs on the first substrate to a second substrate;
  rotating the first substrate in a first direction by 180 degrees;
  moving the first substrate to a second position that is different from the first position;
  transferring a second group of LEDs among the plurality of LEDs on the first substrate to the second substrate; and
  after transferring the second group of LEDs to the second substrate, rotating the first substrate in a second direction that is opposite to the first direction by 180 degrees.

* * * * *